United States Patent
Lee

(10) Patent No.: US 10,020,061 B2
(45) Date of Patent: Jul. 10, 2018

(54) MEMORY SYSTEM AND OPERATING METHOD THEREOF

(71) Applicant: SK hynix Inc., Gyeonggi-do (KR)

(72) Inventor: Jong-Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/407,027

(22) Filed: Jan. 16, 2017

(65) Prior Publication Data
US 2017/0337972 A1    Nov. 23, 2017

(30) Foreign Application Priority Data
May 18, 2016  (KR) .................. 10-2016-0060782

(51) Int. Cl.
| | |
|---|---|
| G11C 16/04 | (2006.01) |
| G11C 16/16 | (2006.01) |
| G11C 16/10 | (2006.01) |
| G06F 3/06 | (2006.01) |
| G11C 16/08 | (2006.01) |
| G11C 16/20 | (2006.01) |
| G11C 29/42 | (2006.01) |
| G11C 29/00 | (2006.01) |
| G11C 29/04 | (2006.01) |

(52) U.S. Cl.
CPC .............. *G11C 16/16* (2013.01); *G06F 3/068* (2013.01); *G06F 3/0625* (2013.01); *G06F 3/0634* (2013.01); *G11C 16/08* (2013.01); *G11C 16/10* (2013.01); *G11C 16/20* (2013.01); *G11C 29/42* (2013.01); *G11C 29/76* (2013.01); *G11C 16/0483* (2013.01); *G11C 2029/0407* (2013.01)

(58) Field of Classification Search
CPC ......... G11C 16/16; G11C 16/10; G11C 16/26; G11C 16/3459
See application file for complete search history.

(56) References Cited

U.S. PATENT DOCUMENTS

| | | | |
|---|---|---|---|
| 9,378,137 B2* | 6/2016 | Kim | ............... G06F 12/0246 |
| 2012/0246392 A1* | 9/2012 | Cheon | ............... G06F 12/0871 |
| | | | 711/103 |
| 2015/0006939 A1* | 1/2015 | Lim | ............... G11C 5/148 |
| | | | 713/324 |
| 2015/0113237 A1 | 4/2015 | Kim | |
| 2015/0193464 A1 | 7/2015 | Kwon et al. | |

* cited by examiner

*Primary Examiner* — Pho M Luu
(74) *Attorney, Agent, or Firm* — IP & T GROUP LLP

(57) ABSTRACT

A memory system may include a memory device including a plurality of memory blocks each memory block including a plurality of pages; and a controller suitable for non-sequentially selecting some pages among a plurality of pages included in an open block among the plurality of blocks, checking a program state or an erase state of each of the selected pages, and searching for a boundary page between the program state pages and the erase state pages among the plurality of pages.

14 Claims, 16 Drawing Sheets

MEMORY SYSTEM AND OPERATING METHOD THEREOF

CROSS-REFERENCE TO RELATED APPLICATIONS

The present application claims priority under 35 U.S.C 119(a) to Korean Patent Application No. 10-2016-0060782, filed on May 18, 2016, which is incorporated herein by reference in its entirety.

BACKGROUND

1. Field

Various embodiments of the present invention relate generally to a semiconductor design technology and, more particularly, to a memory system supporting a restoration operation after a sudden power-off (SPO), and an operating method thereof.

2. Description of the Related Art

The computer environment paradigm has changed to ubiquitous computing systems that can be used anytime and anywhere. Due to this, use of portable electronic devices such as mobile phones, digital cameras, and notebook computers has rapidly increased. These portable electronic devices generally use a memory system employing one or more memory devices for storing data. A memory system may be used as a main memory device or an auxiliary memory device of a portable electronic device.

Generally, memory systems using memory devices provide excellent stability, durability, high information access speed, and low power consumption, since they have no moving parts. Examples of memory systems having such advantages include universal serial bus (USB) memory devices, memory cards having various interfaces, and solid state drives (SSD).

SUMMARY

Various embodiments of the present invention are directed to a memory system capable of searching an erase page through a minimum check operation in an open memory block after a sudden power-off (SPO), and an operating method of the memory system.

In an embodiment, a memory system may include: a memory device including a plurality of memory blocks each memory block including a plurality of pages; and a controller suitable for non-sequentially selecting some pages among a plurality of pages included in an open block among the plurality of blocks, checking a program state or an erase state of each of the selected pages, and searching for a boundary page between the program state pages and the erase state pages among the plurality of pages.

The controller may non-sequentially select pages through a binary search between a starting page and a last page among the plurality of pages.

When two pages that are consecutively selected through the binary search are in opposite states and physically continuous to each other, the controller may select a page between the two pages which is in the erase state as the boundary page.

When two pages that are consecutively selected through the binary search are in opposite states and are not physically continuous to each other, the controller may sequentially select pages included between the two consecutively selected pages through a linear search and checks the state of each of the selected pages.

The controller may select one page for each interval of K pages obtained by dividing all pages included in a search range by N, may check a state of the selected pages, and may repeat a range set operation to reset the search range to include (K-1) pages based on a check result until the number of (K-1) pages is less than the predetermined number of pages and sets all the pages included in the open block at an initial stage as the search range.

The range set operation may be to select one page for each interval of K pages obtained by dividing all the pages included in the search range and the program/erase states of the respective selected pages and reset the (K-1) pages included between two pages which are in the opposite states as the search range.

The controller may sequentially select the (K-1) pages included in the search range through the linear search and checks the state of each of the selected pages after the number of the (K-1) pages is less than the predetermined number of pages through the range set operation.

The controller may non-sequentially select the (K-1) pages included in the search range through the binary search and checks the state of each of the selected pages after the number of the (K-1) pages is less than the predetermined number of pages through the range set operation.

The controller may sequentially select one page for each interval of M pages from a staring page among the plurality of pages and checks the states of the selected pages and when a page selected earlier and a page selected next among two pages that are consecutively selected are in the opposite states, the controller may select pages included between the page selected earlier and the page selected next through a linear search and checks the state of each of the selected pages.

The controller may enter a scan mode in a power-on state after a sudden power-off occurs during a program operation on the plurality of blocks, and classifies the memory blocks in closed, open and free memory blocks.

In an embodiment, a method for operating a memory system including a memory device including a plurality of blocks may include: classifying the plurality of blocks into one of a closed block, an open block, and a free block in response to entry into a scan mode; non-sequentially selecting some pages among a plurality of pages included in the open block; checking the program/erase states of the selected pages; searching for an erase state page which is a boundary between the program state and the erase state among the plurality of pages based on the checking result.

The non-sequentially selecting of some of the pages may include: non-sequentially selecting pages between a starting page and a last page among the plurality of pages through a binary search.

The non-sequentially selecting of some of the pages may include: selecting a page in the erase state among a page selected earlier and a page selected next among two pages that are consecutively selected within intervals of the predetermined number of pages through the binary search as the erase state page which is the boundary page between the program state pages and the erase state pages in the open block when the page selected earlier and the page selected next are in the opposite states and physically continuous to each other.

The non-sequentially selecting of some of the pages may further include: sequentially selecting pages included between the page selected earlier and the page selected next through a linear search when the page selected earlier and the page selected next are in the opposite states and physically discontinuous to each other.

The searching of the erase state page may include: selecting one page for each interval of K pages obtained by dividing all pages included in a search range by N; checking the states of the selected pages; resetting the search range to include (K−1) pages based on the checking result; and repeatedly resetting the search range until the number of (K−1) pages is less than the predetermined number of pages after all the plurality of pages at an initial stage are set as the search range.

The resetting of the search range may include: selecting one page for each interval of K pages obtained by dividing all the pages included in the search range by N; checking the states of the selected pages; and resetting the (K−1) pages included between two pages which are in the opposite states as the search range.

The searching of the erase state page may further include: sequentially selecting the (K−1) pages included in the search range through the linear search; and checking the states of the selected pages after the number of (K−1) pages is less than the predetermined number of pages through the repeated resetting of the search range.

The searching of the erase state page may further include: non-sequentially selecting the (K−1) pages included in the search range through the binary search; and checking the states of the selected pages after the number of K pages is less than the predetermined number of pages through the repeated resetting of the search range.

The searching of the erase state page may include: sequentially selecting one page for each interval of M pages from a starting page among the plurality of pages; selecting pages included between a page selected earlier and a page selected next among two pages that are consecutively selected through the linear search when the page selected earlier and the page selected next are in the opposite states; and checking the state of each of the selected pages.

The method may further include: entering the scan mode in a power-on state after a sudden power-off occurs during a program operation on the blocks.

BRIEF DESCRIPTION OF THE DRAWINGS

These and other features and advantages of the present invention of the present invention will be described in reference to the accompanying drawings, wherein.

DETAILED DESCRIPTION

Figure 1:
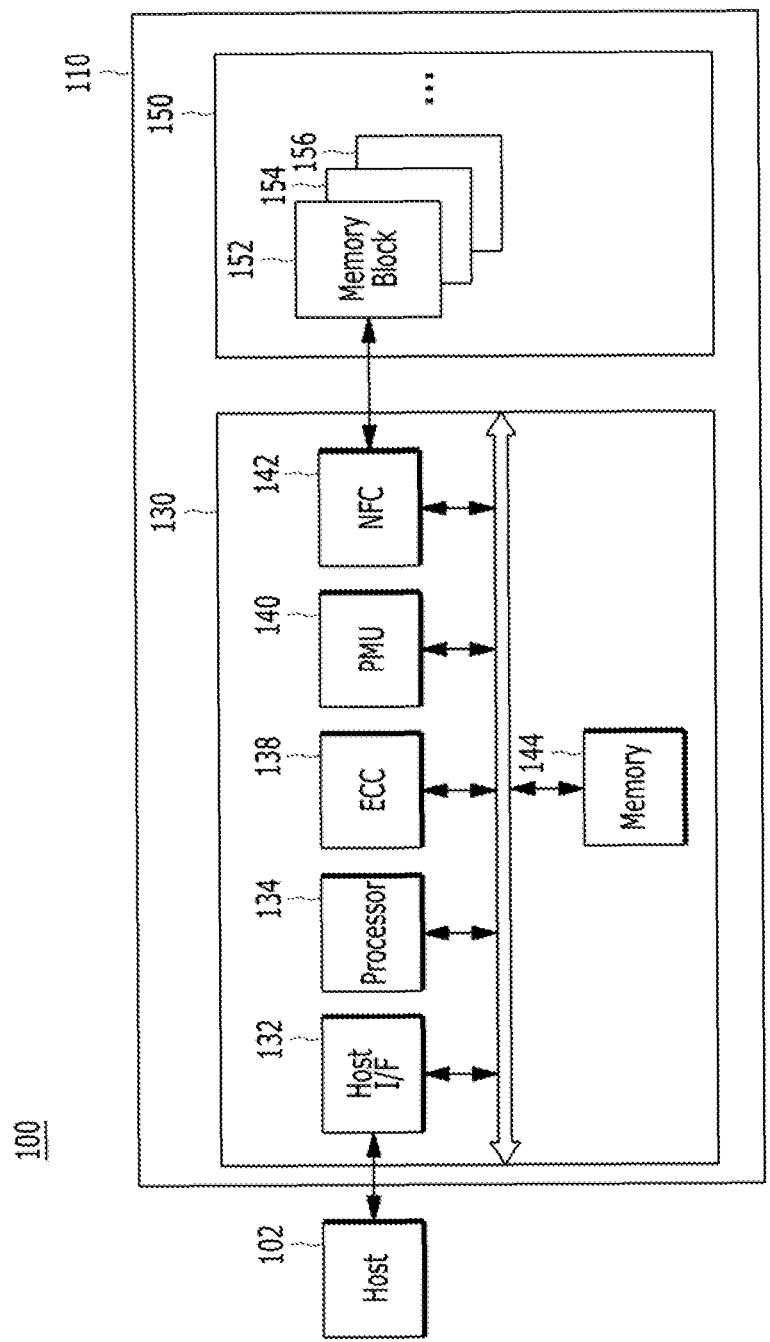
FIG. 1 is a diagram illustrating a data processing system including a memory system, according to an embodiment of the present invention.

Although, various embodiments are described below in more detail with reference to the accompanying drawings, we note that the present invention may, however, be embodied in different forms and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "Includes," and "Including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 illustrates a data processing system 100 including a memory system, according to an embodiment of the present invention.

Referring to FIG. 1, the data processing system 100 may include a host 102 and a memory system 110.

The host 102 may include, for example, a portable electronic device such as a mobile phone, an MP3 player and a laptop computer or an electronic device such as a desktop computer, a game player, a television (TV) and a projector.

The memory system 110 may operate in response to a request from the host 102. For example, the memory system 110 may store data to be accessed by the host 102. The memory system 110 may be used as a main memory or an auxiliary memory of the host 102. The memory system 110 may be implemented with any one of various storage devices, according to the protocol of a host interface to be coupled electrically with the host 102. The memory system 110 may be implemented with any one of various storage devices, such as, for example, a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices forming the memory system 110 may be implemented with a volatile memory device, such as, a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase-change RAM (PRAM), a magnetoresistive RAM (MRAM), a resistive RAM (RRAM) and a flash memory.

The memory system 110 may include a memory device 150 and a controller 130. The memory device 150 stores data to be accessed by the host 102, and the controller 130 controls data exchange between the memory device 150 and the host 102. That is, under the control of the controller 130, data received from the host may be stored in the memory device 150.

The controller 130 and the memory device 150 may be integrated into one semiconductor device. For instance, the controller 130 and the memory device 150 may be integrated into one semiconductor device to form a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device to form a memory card, such as, for example, a Personal Computer Memory Card International Association (PCMCIA) card, a compact flash (CF) card, a smart media card (SMC), a memory stick, a multimedia card (MMC), an RS-MMC, a micro-MMC, a secure digital (SD) card, a mini-SD, a micro-SD, an SDHC, and a universal flash storage (UFS) device.

For another instance, the memory system 110 may configure a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage for a data center, a device capable of transmitting and receiving information under a wireless environment, one of various electronic devices for a home network, one of various electronic devices for a computer network, one of various electronic devices for a telematics network, an RFID device, or one of various component elements for a computing system.

The memory device 150 may retain stored data even when power is blocked, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of a word line (WL) are electrically coupled. The memory cells may be single bit cells or multi-bit cells. The memory cells may be arranged in a two or three dimensional stacked structure. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 11.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program, and erase operations.

For example, the controller 130 may include a host interface (I/F) unit 132, a processor 134, an error correction code (ECC) unit 138, a power management unit (PMU) 140, a NAND flash controller (NFC) 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory such as a static random access memory (SRAM) or a dynamic random access memory (DRAM). As described above, the memory 144 may store data used by the host 102 and the memory device 150 for the read and write operations. For such storage of the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

Figure 2:
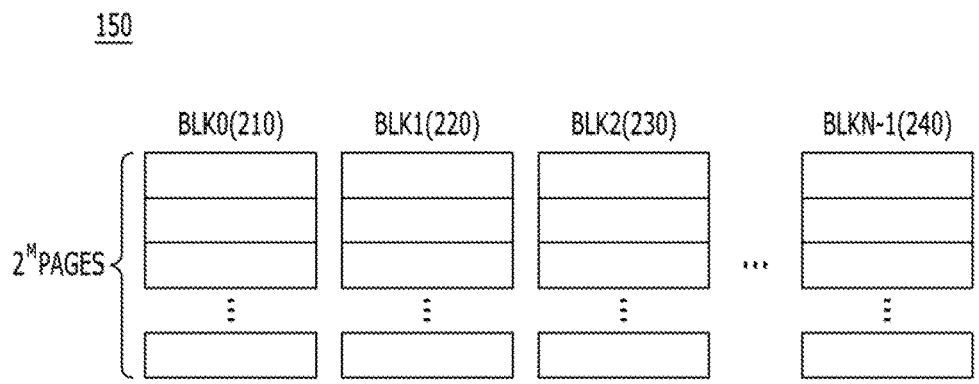
FIG. 2 is a diagram illustrating an example of a memory device employed in the memory system of FIG. 1.

FIG. 2 is a detailed diagram of the memory device 150 shown in FIG. 1.

Referring to FIG. 2, the memory device 150 may include a plurality of memory blocks, for example, a zeroth memory block (BLOCK0) 210, a first memory block (BLOCK1) 220, a second memory block (BLOCK2) 230 and an N-1$^{th}$ memory block (BLOCKN-1) 240. Each of the memory blocks 210 to 240 may include a plurality of pages, for example, $2^M$ number of pages ($2^M$ PAGES). Each of the pages may include a plurality of memory cells to which a plurality of word lines are electrically coupled.

Also, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Each of the memory blocks 210 to 240 may store the data provided from the host 102 during a write operation, and provide the stored data to the host 102 during a read operation.

Figure 3:
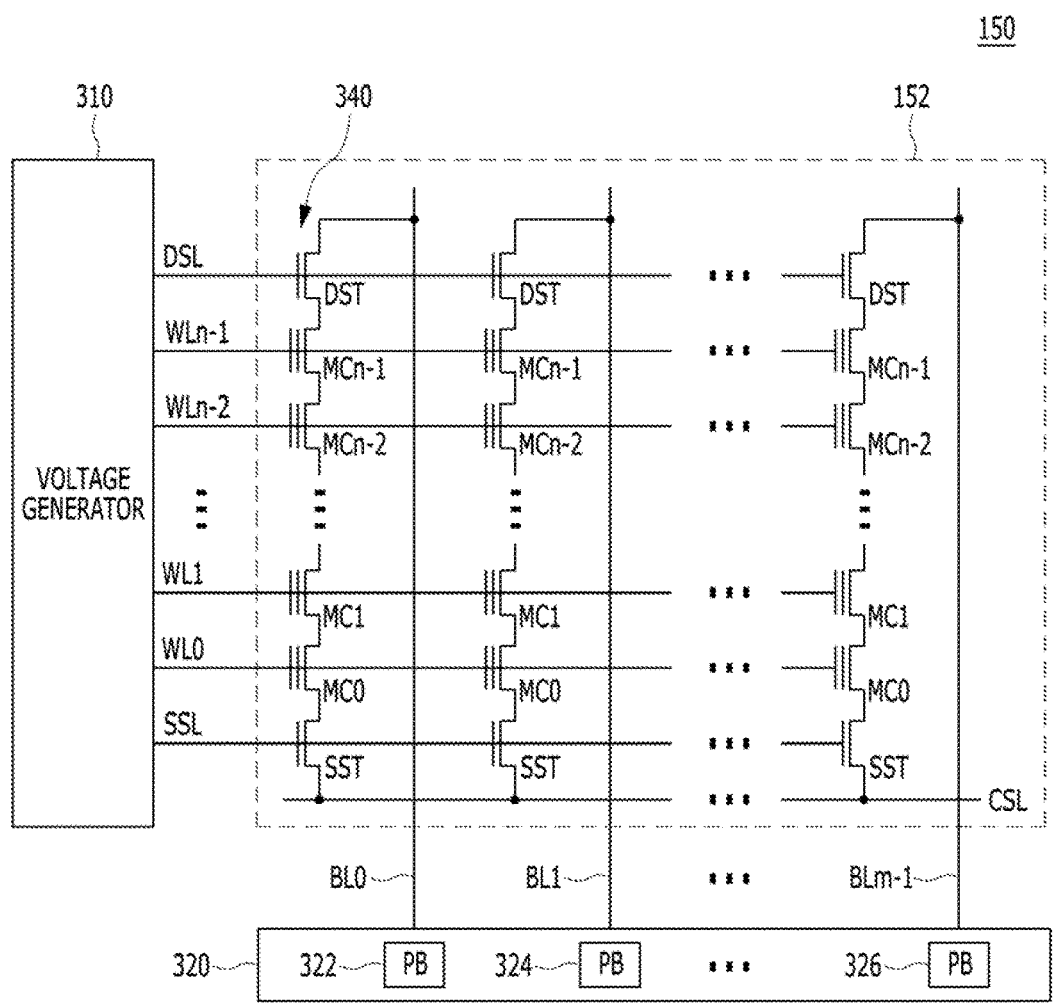
FIG. 3 is a circuit diagram illustrating a memory block in a memory device, according to an embodiment of the present invention.

FIG. 3 is a diagram illustrating a memory device 150 including the memory block shown in FIG. 2. FIG. 3 shows a detailed configuration of a single memory block 330 and circuits related thereto 310 and 320.

Referring to FIG. 3, the memory block 330 may include a plurality of cell strings 340 which are electrically coupled to bit lines BL0 to BLm-1, respectively. The cell string 340 of each column may include at least one drain select transistor (i.e., string select transistor) DST and at least one ground select transistor (i.e., source select transistor) GST. A plurality of memory cell transistors MC0 to MCn-1 may be electrically coupled in series between the select transistors GST and DST. The respective memory cells MC0 to MCn-1 may be configured by multi-level cells (MLC) each of which stores data information of a plurality of bits. The cell strings 340 may be electrically coupled to the corresponding bit lines BL0 to BLm-1, respectively. For reference, in FIG. 3, 'DSL' denotes a drain select line (i.e., a string select line), 'GSL' denotes a ground select line (i.e., a source select line), and 'CSL' denotes a common source line.

While FIG. 3 shows, as an example, the memory block 330 which is configured by NAND flash memory cells, it is to be noted that the memory block 330 of the memory device 300 according to an exemplary embodiment of the present invention is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 300 may provide word line voltages, for example, a program voltage, a read voltage and a pass voltage, to be supplied to respective word lines according to an operation mode and voltages to be supplied to bulks, for example, well regions, where the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 300 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to columns (or bit lines) or pairs of columns (or pairs of bit lines), and a plurality of latches (not shown) may be included in each of the page buffers 322, 324 and 326.

FIGS. 4 to 11 are schematic diagrams illustrating various aspects of the memory device 150 of FIG. 1.

Figure 4:
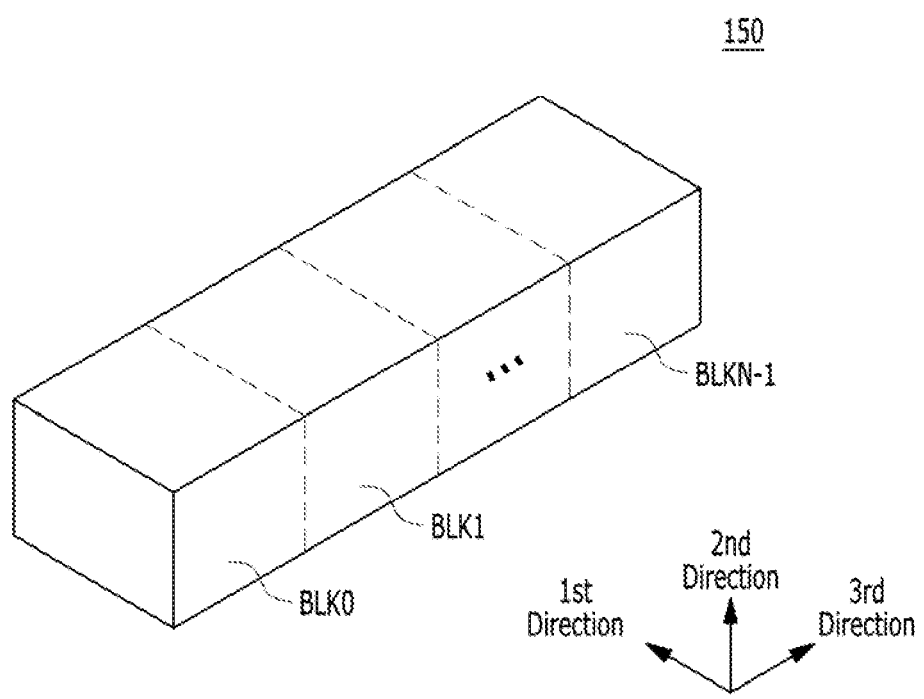
FIGS. 4 to 11 are diagrams schematically illustrating various aspects of the memory device of FIG. 1.

FIG. 4 is a block diagram illustrating an example of the plurality of memory blocks of the memory device 150.

Referring to FIG. 4, the memory device 150 may include a plurality of memory blocks BLK0 to BLKN−1, and each of the memory blocks BLK0 to BLKN−1 may be realized in a three-dimensional (3D) structure or a vertical structure. The respective memory blocks BLK0 to BLKN−1 may include structures which extend in first to third directions, for example, an x-axis direction, a y-axis direction and a z-axis direction.

The respective memory blocks BLK0 to BLKN−1 may include a plurality of NAND strings extending in the second direction. The plurality of NAND strings may be provided in the first direction and the third direction. Each NAND string may be electrically coupled to a bit line, at least one drain select line, at least one ground select line, a plurality of word lines, at least one dummy word line, and a common source line. Namely, the respective memory blocks BLK0 to BLKN−1 may be electrically coupled to a plurality of bit lines, a plurality of drain select lines, a plurality of ground select lines, a plurality of word lines, a plurality of dummy word lines, and a plurality of common source lines.

Figure 5:
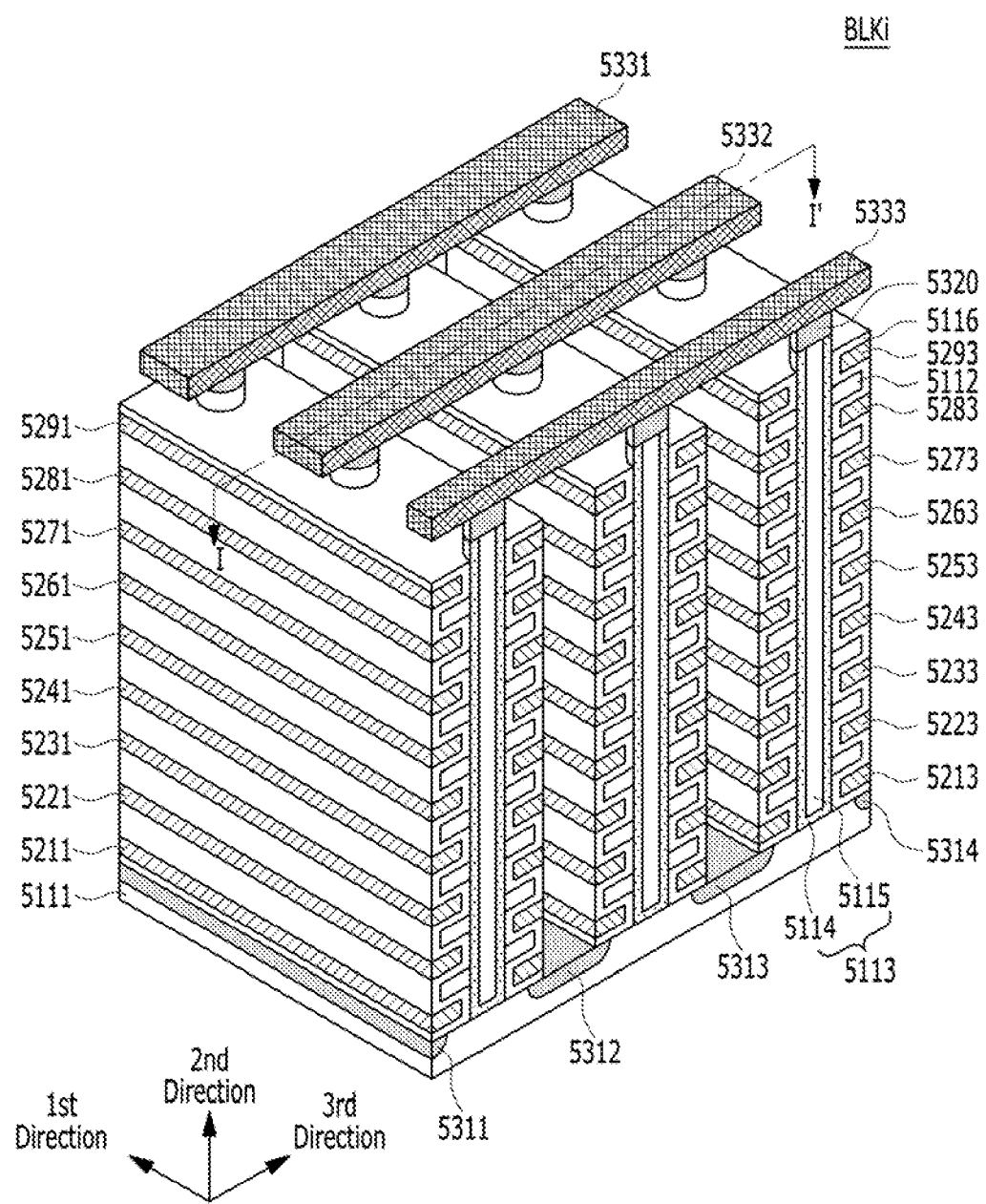
Figure 6:
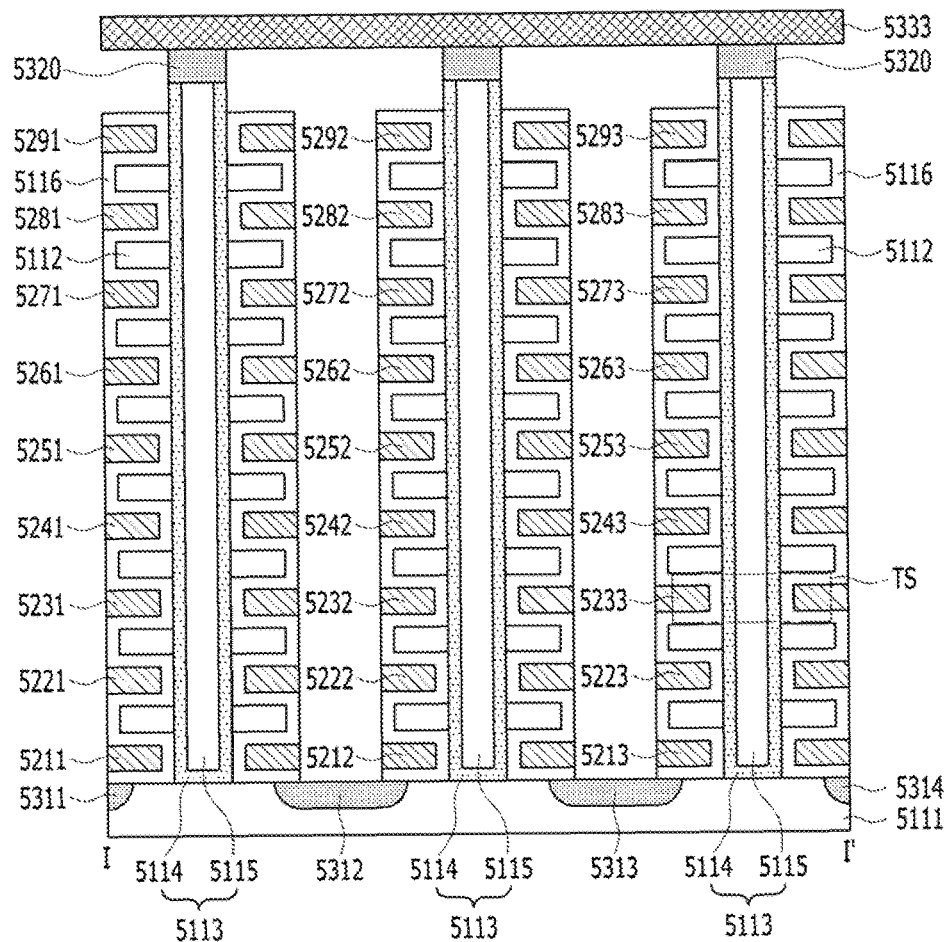

FIG. 5 is a perspective view of one BLKi of the plural memory blocks BLK0 to BLKN−1 of FIG. 4. FIG. 6 is a cross-sectional view taken along a line I-I' of the memory block BLKi of FIG. 5.

Referring to FIGS. 5 and 6, a memory block BLKi among the plurality of memory blocks of the memory device 150 may include a structure which extends in the first to third directions.

A substrate 5111 may be provided. The substrate 5111 may include a silicon material doped with a first type impurity. The substrate 5111 may include a silicon material doped with a p-type impurity or may be a p-type well, for example, a pocket p-well, and include an n-type well which surrounds the p-type well. While it is assumed that the substrate 5111 is p-type silicon, it is to be noted that the substrate 5111 is not limited to being p-type silicon.

A plurality of doped regions 5311 to 5314 extending in the first direction may be provided on the substrate 5111. The plurality of doped regions 5311 to 5314 may contain impurities (i.e., second type impurities), different from the impurities contained in the substrate 5111 (i.e., first type impurities). The plurality of doped regions 5311 to 5314 may be doped with an n-type impurity. While it is assumed here that first to fourth doped regions 5311 to 5314 are n-type, it is to be noted that the first to fourth doped regions 5311 to 5314 are not limited to being n-type. In an exemplary embodiment, the plurality of doped regions 5311 to 5314 may be formed in the substrate 5111.

In the region over the substrate 5111 between the first and second doped regions 5311 and 5312, a plurality of dielectric materials 5112 extending in the first direction may be sequentially provided in the second direction. The dielectric materials 5112 and the substrate 5111 may be separated from one another by a predetermined distance in the second direction. The dielectric materials 5112 may be separated from one another by a predetermined distance in the second direction. The dielectric materials 5112 may include a dielectric material such as silicon oxide, silicon nitride, silicon oxy-nitride, or combinations thereof.

In the region over the substrate 5111 between the first and second doped regions 5311 and 5312, a plurality of pillars 5113 which are sequentially disposed in the first direction and pass through the dielectric materials 5112 in the second direction may be provided. The plurality of pillars 5113 may respectively pass through the dielectric materials 5112 and may be electrically coupled with the substrate 5111. Each pillar 5113 may be configured by a plurality of materials. A surface layer 5114 of each pillar 5113 may include a silicon material doped with the first type of impurity. The surface layer 5114 of each pillar 5113 may include a silicon material doped with the same type of impurity as the substrate 5111. While it is assumed here that the surface layer 5114 of each pillar 5113 may include p-type silicon, the surface layer 5114 of each pillar 5113 is not limited to being p-type silicon. In an exemplary embodiment, the surface layer 5114 may be in directly contact with the substrate 5111.

An inner layer 5115 of each pillar 5113 may be formed of a dielectric material. The inner layer 5115 of each pillar 5113 may be filled by a dielectric material such as silicon oxide.

In the region between the first and second doped regions 5311 and 5312, a dielectric layer 5116 may be provided along the exposed surfaces of the dielectric materials 5112, the pillars 5113 and the substrate 5111. The thickness of the dielectric layer 5116 may be less than half of the distance between the dielectric materials 5112. In other words, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doped regions 5311 and 5312, conductive materials 5211 to 5291 may be provided over the exposed surface of the dielectric layer 5116. The conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5116 disposed over the substrate 5111 and (ii) the dielectric layer 5116 disposed over the bottom surface of the dielectric material 5112 adjacent to the substrate 5111.

The conductive material which extends in the first direction may be provided between (i) the dielectric layer 5116 disposed over the top surface of one of the dielectric materials 5112 and (ii) the dielectric layer 5116 disposed over the bottom surface of another dielectric material of the dielectric materials 5112, which is disposed over the certain dielectric material 5112. The conductive materials 5221 to 5281 extending in the first direction may be provided between the dielectric materials 5112. The conductive material 5291 which extends in the first direction may be provided over the uppermost dielectric material 5112. The conductive materials 5211 to 5291 extending in the first direction may be a metallic material. The conductive materials 5211 to 5291 extending in the first direction may be a conductive material such as polysilicon, metal, metal-nitride, metal-oxide, metal-silicide, conductive carbon, or combinations thereof.

In the region between the second and third doped regions 5312 and 5313, the same structures as the structures between the first and second doped regions 5311 and 5312 may be provided. For example, in the region between the second and third doped regions 5312 and 5313, the plurality of dielectric materials 5112 extending in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 extending in the first direction may be provided.

In the region between the third and fourth doped regions 5313 and 5314, the same structures as between the first and second doped regions 5311 and 5312 may be provided. For example, in the region between the third and fourth doped regions 5313 and 5314, the plurality of dielectric materials 5112 extending in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 extending in the first direction may be provided.

Drains 5320 may be respectively provided over the plurality of pillars 5113. The drains 5320 may be silicon materials doped with second type impurities. The drains 5320 may be silicon materials doped with n-type impurities. While it is assumed for the sake of convenience that the drains 5320 include n-type silicon, it is to be noted that the drains 5320 are not limited to being n-type silicon. For example, the width of each drain 5320 may be larger than the width of each corresponding pillar 5113. Each drain 5320 may be provided in the shape of a pad over the top surface of each corresponding pillar 5113.

Conductive materials 5331 to 5333 extending in the third direction may be provided over the drains 5320. The conductive materials 5331 to 5333 may be sequentially disposed in the first direction. The respective conductive materials 5331 to 5333 may be electrically coupled with the drains 5320 of corresponding regions. The drains 5320 and the conductive materials 5331 to 5333 extending in the third direction may be electrically coupled with through contact plugs. The conductive materials 5331 to 5333 extending in the third direction may be a metallic material. The conductive materials 5331 to 5333 extending in the third direction may be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 extending in the first direction. The respective pillars 5113 may form NAND strings together with the dielectric layer 5116 and the conductive materials 5211 to 5291, 5212 to 5292 and 5213 to 5293 extending in the first direction. Each NAND string may include a plurality of transistor structures TS.

Figure 7:
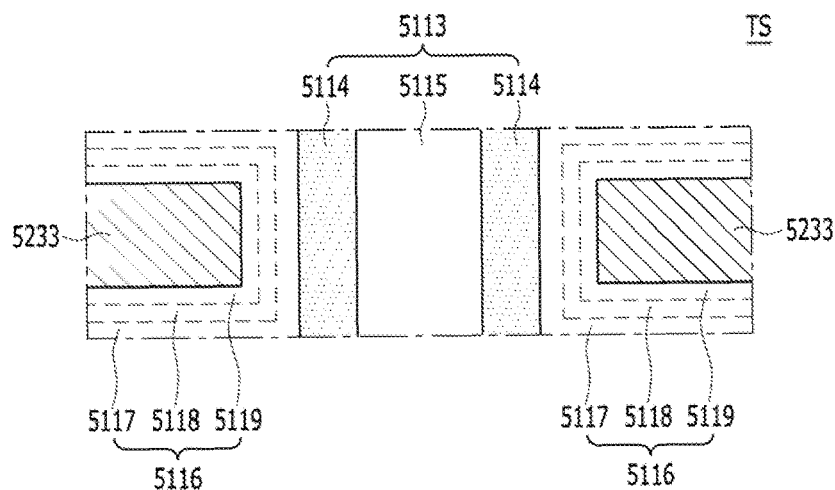

FIG. 7 is a detailed cross-sectional view of the transistor structure TS of FIG. 6.

Referring to FIG. 7, in the transistor structure TS of FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 which extends in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience, the surface layer 5114 of p-type silicon in each of the pillars 5113 will be referred to as a body in the second direction.

The memory block BLKi may include the plurality of pillars 5113. Namely, the memory block BLKi may include the plurality of NAND strings. In detail, the memory block BLKi may include the plurality of NAND strings extending in the second direction or a direction perpendicular to the substrate 5111.

Each NAND string may include the plurality of transistor structures TS which are disposed in the second direction. At least one of the plurality of transistor structures TS of each NAND string may serve as a drain select transistor (i.e., a string select transistor). At least one of the plurality of transistor structures TS of each NAND string may serve as a ground select transistor (i.e., a source select transistor).

The gates or control gates may correspond to the conductive materials 5211 to 5291, 5212 to 5292 and 5213 to 5293 extending in the first direction. In other words, the gates or the control gates may extend in the first direction and form word lines and at least one drain select line and at least one ground select line.

The conductive materials 5331 to 5333 extending in the third direction may be electrically coupled to one end of the NAND strings. The conductive materials 5331 to 5333 extending in the third direction may serve as bit lines. That is, in one memory block BLKi, the plurality of NAND strings may be electrically coupled to one bit line.

The second type doped regions 5311 to 5314 extending in the first direction may be provided to the other ends of the NAND strings. The second type doped regions 5311 to 5314 extending in the first direction may serve as common source lines.

Namely, the memory block BLKi may include a plurality of NAND strings extending in a direction perpendicular to the substrate 5111, e.g., the second direction, and may serve as a NAND flash memory block, for example, of a charge capturing type memory, in which a plurality of NAND strings are electrically coupled to one bit line.

While it is illustrated in FIGS. 5 to 7 that the conductive materials 5211 to 5291, 5212 to 5292 and 5213 to 5293 extending in the first direction are provided in 9 layers, it is to be noted that the conductive materials 5211 to 5291, 5212 to 5292 and 5213 to 5293 extending in the first direction are not limited to being provided in 9 layers. For example, conductive materials extending in the first direction may be provided in 8 layers, 16 layers or any multiple of layers. In other words, in one NAND string, the number of transistors may be 8, 16 or more.

While it is illustrated in FIGS. 5 to 7 that 3 NAND strings are electrically coupled to one bit line, it is to be noted that the embodiment is not limited to having 3 NAND strings that are electrically coupled to one bit line. In the memory block BLKi, m number of NAND strings may be electrically coupled to one bit line, where m is a positive integer. According to the number of NAND strings which are electrically coupled to one bit line, the number of conductive materials 5211 to 5291, 5212 to 5292 and 5213 to 5293 extending in the first direction and the number of common source lines 5311 to 5314 may be controlled as well.

Further, while it is illustrated in FIGS. 5 to 7 that 3 NAND strings are electrically coupled to one conductive material which extends in the first direction, it is to be noted that the embodiment is not limited to having 3 NAND strings electrically coupled to one conductive material which extends in the first direction. For example, n number of NAND strings may be electrically coupled to one conductive material which extends in the first direction, n being a positive integer. According to the number of NAND strings which are electrically coupled to one conductive material which extends in the first direction, the number of bit lines 5331 to 5333 may be controlled as well.

Figure 8:
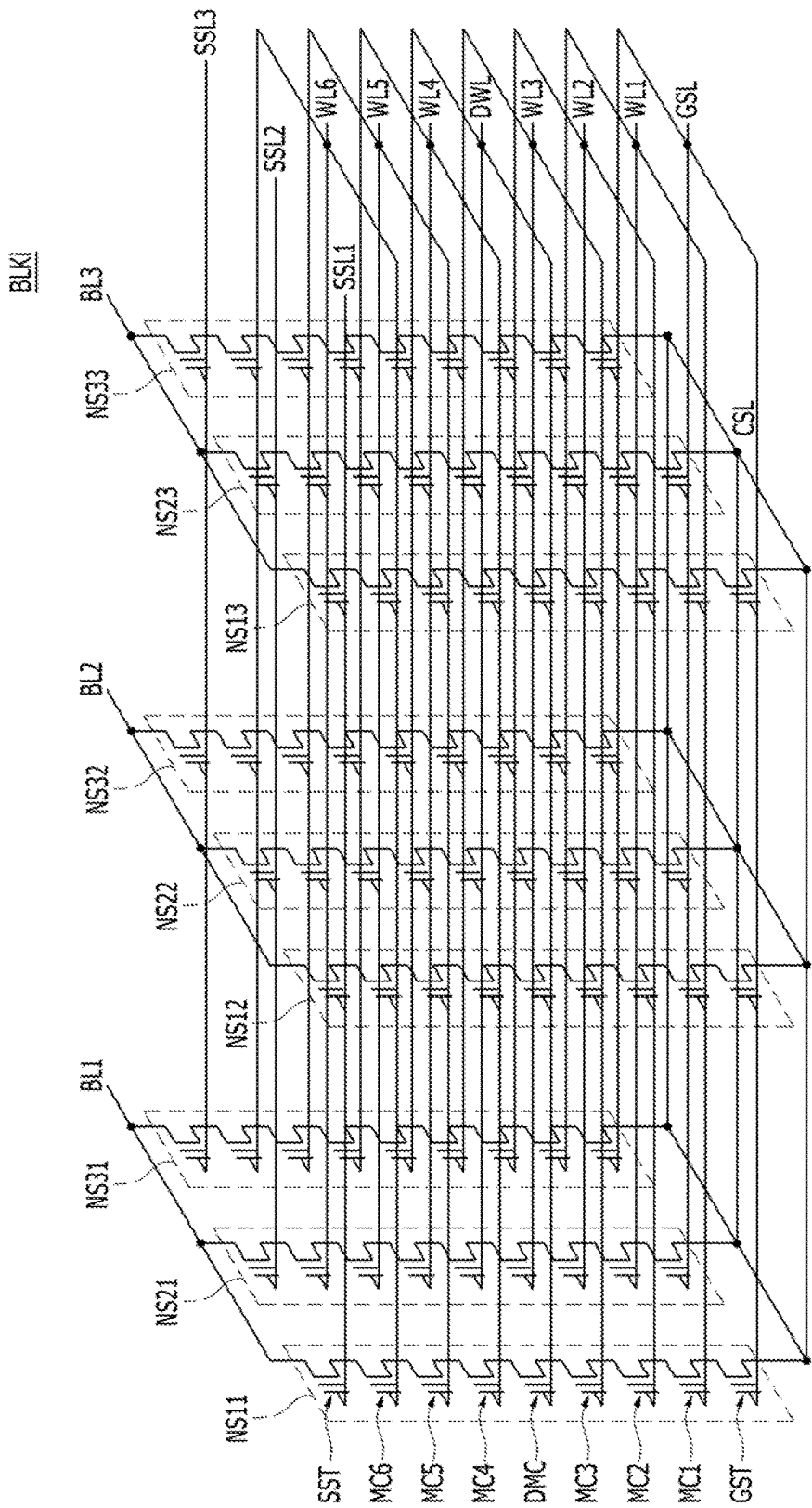

FIG. 8 is a circuit diagram illustrating the memory block BLKi having a first structure described with reference to FIGS. 5 to 7.

Referring to FIG. 8, in a block BLKi having the first structure, NAND strings NS11 to NS31 may be provided between a first bit line BL1 and a common source line CSL. The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A drain select transistor (i.e., a string select transistor) DST of each NAND string may be electrically coupled to a corresponding bit line. A ground select transistor (i.e., a source select transistor) GST of each NAND string may be electrically coupled to the common source line CSL. Memory cells MC1 to MC6 may be provided between the drain select transistor DST and the ground select transistor GST of each NAND string.

In this example, NAND strings may be defined by units of rows and columns and NAND strings which are electrically coupled to one bit line may form one column. The NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings which are electrically coupled to one drain select line may form one row. The NAND strings NS11 to NS13 which are electrically coupled to a first drain select line DSL1 may form a first row, the NAND strings NS21 to NS23 which are electrically coupled to a second drain select line DSL2 may form a second row, and the NAND strings NS31 to NS33 which are electrically coupled to a third drain select line DSL3 may form a third row.

In each NAND string, a height may be defined. In each NAND string, the height of a memory cell MC1 adjacent to the ground select transistor GST may have a value '1'. In each NAND string, the height of a memory cell may increase as the memory cell gets closer to the drain select transistor DST when measured from the substrate 5111. In each NAND string, the height of a memory cell MC6 adjacent to the drain select transistor DST may be 7.

The drain select transistors DST of the NAND strings in the same row may share the drain select line DSL. The drain select transistors of the NAND strings in different rows may be respectively electrically coupled to the different drain select lines DSL1, DSL2 and DSL3.

The memory cells at the same height in the NAND strings in the same row may share a word line. That is, at the same height, the word lines electrically coupled to the memory cells of the NAND strings in different rows may be electrically coupled. Dummy memory cells DMC at the same height in the NAND strings of the same row may share a dummy word line DWL. Namely, at the same height or level, the dummy word lines DWL electrically coupled to the dummy memory cells DMC of the NAND strings in different rows may be electrically coupled.

The word lines or the dummy word lines DWL located at the same level or height or layer may be electrically coupled with one another at layers where the conductive materials 5211 to 5291, 5212 to 5292 and 5213 to 5293 extending in the first direction may be provided. The conductive materials 5211 to 5291, 5212 to 5292 and 5213 to 5293 extending in the first direction may be electrically coupled in common to upper layers through contacts. At the upper layers, the conductive materials 5211 to 5291, 5212 to 5292 and 5213 to 5293 extending in the first direction may be electrically coupled. In other words, the ground select transistors GST of the NAND strings in the same row may share the ground select line GSL. Further, the ground select transistors GST of the NAND strings in different rows may share the ground select line GSL. That is, the NAND strings NS11 to NS13, NS21 to NS23 and NS31 to NS33 may be electrically coupled to the ground select line GSL.

The common source line CSL may be electrically coupled to the NAND strings. Over the active regions and over the substrate 5111, the first to fourth doped regions 5311 to 5314 may be electrically coupled. The first to fourth doped regions 5311 to 5314 may be electrically coupled to an upper layer through contacts and, at the upper layer, the first to fourth doped regions 5311 to 5314 may be electrically coupled.

Namely, as of FIG. 8, the word lines of the same height or level may be electrically coupled. Accordingly, when a word line at a specific height is selected, all NAND strings which are electrically coupled to the word line may be selected. The NAND strings in different rows may be electrically coupled to different drain select lines. Accordingly, among the NAND strings electrically coupled to the same word line, by selecting one of the drain select lines DSL1 to DSL3, the NAND strings in the unselected rows may be electrically isolated from the bit lines BL1 to BL3. In other words, by selecting one of the drain select lines DSL1 to DSL3, a row of NAND strings may be selected. Moreover, by selecting one of the bit lines BL1 to BL3, the NAND strings in the selected rows may be selected in units of columns.

In each NAND string, a dummy memory cell DMC may be provided. In FIG. 8, the dummy memory cell DMC may be provided between a third memory cell MC3 and a fourth memory cell MC4 in each NAND string. That is, first to third memory cells MC1 to MC3 may be provided between the dummy memory cell DMC and the ground select transistor GST. Fourth to sixth memory cells MC4 to MC6 may be provided between the dummy memory cell DMC and the drain select transistor DST. The memory cells of each NAND string may be divided into memory cell groups by the dummy memory cell DMC. In the divided memory cell groups, memory cells, for example, MC1 to MC3, adjacent to the ground select transistor GST may be referred to as a lower memory cell group, and memory cells, for example, MC4 to MC6, adjacent to the drain select transistor (i.e., string select transistor DST) may be referred to as an upper memory cell group.

Hereinbelow, detailed descriptions will be made with reference to FIGS. 9 to 11, which show the memory device in the memory system according to an embodiment implemented with a three-dimensional (3D) nonvolatile memory device different from the first structure.

Figure 9:
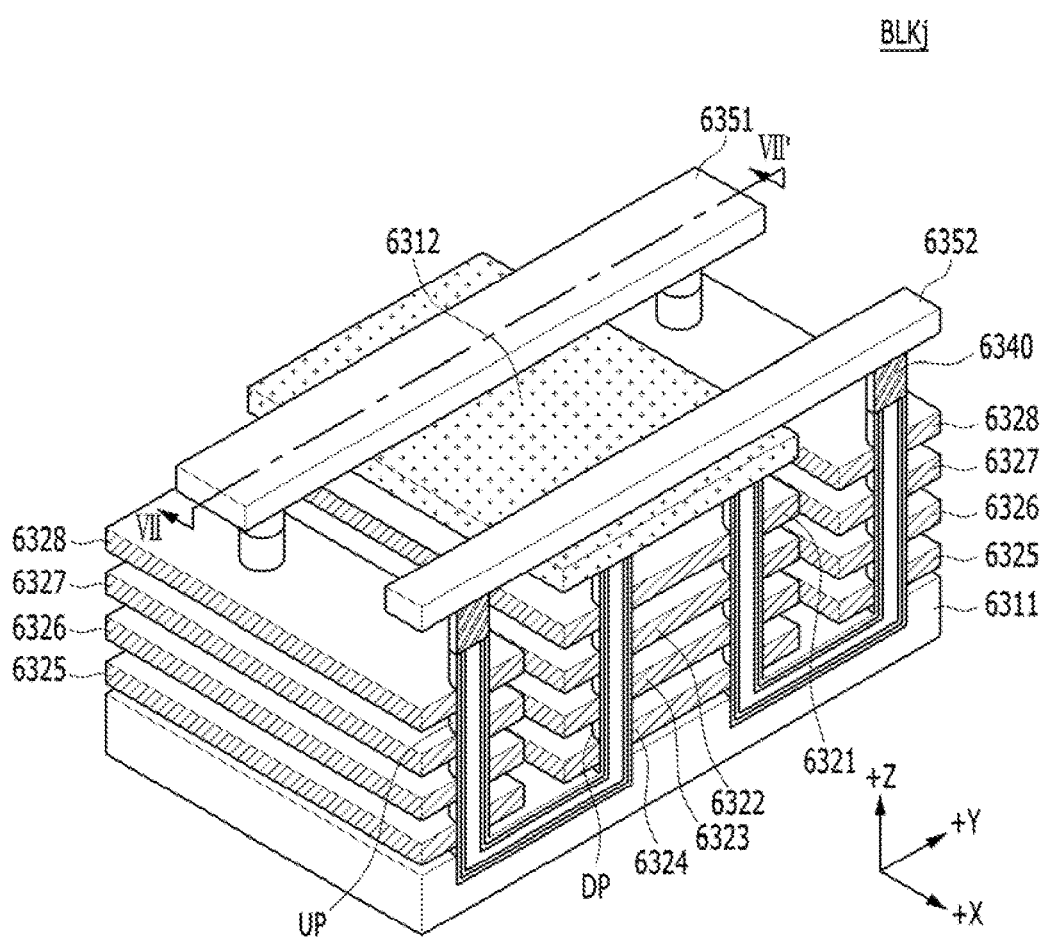

FIG. 9 is a perspective view schematically illustrating the memory device implemented with the three-dimensional (3D) nonvolatile memory device, which is different from the first structure described above with reference to FIGS. 5 to 8, and showing a memory block BLKj of the plurality of memory blocks of FIG. 4. FIG. 10 is a cross-sectional view illustrating the memory block BLKj taken along the line II-II' of FIG. 9.

Figure 10:
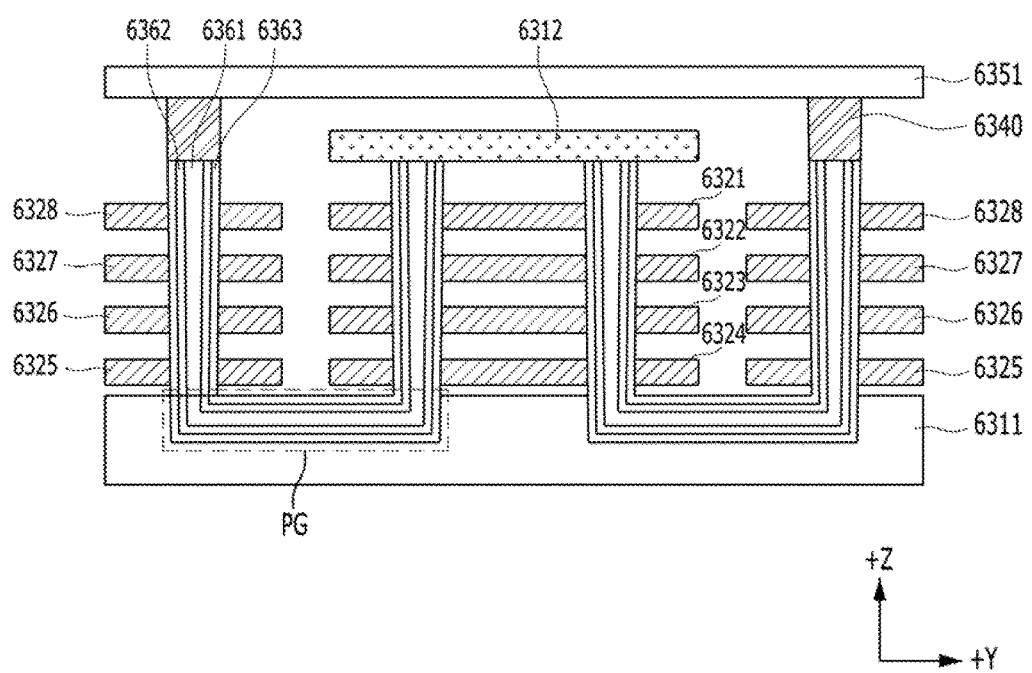

Referring to FIGS. 9 and 10, the memory block BLKj among the plurality of memory blocks of the memory device 150 of FIG. 1 may include structures extending in the first to third directions (i.e., x-axis, y-axis, and z-axis).

A substrate 6311 may be provided. For example, the substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. While it is assumed in the embodiment for the sake of convenience that the substrate 6311 is p-type silicon, it is to be noted that the substrate 6311 is not limited to being p-type silicon.

First to fourth conductive materials 6321 to 6324 extending in the x-axis direction and the y-axis direction are provided over the substrate 6311. The first to fourth conductive materials 6321 to 6324 may be separated by a predetermined distance in the z-axis direction.

Fifth to eighth conductive materials 6325 to 6328 extending in the x-axis direction and the y-axis direction may be provided over the substrate 6311. The fifth to eighth conductive materials 6325 to 6328 may be separated by the predetermined distance in the z-axis direction. The fifth to eighth conductive materials 6325 to 6328 may be separated from the first to fourth conductive materials 6321 to 6324 in the y-axis direction.

A plurality of lower pillars DP which pass through the first to fourth conductive materials 6321 to 6324 may be provided. Each lower pillar DP extends in the z-axis direction. Also, a plurality of upper pillars UP which pass through the fifth to eighth conductive materials 6325 to 6328 may be provided. Each upper pillar UP extends in the z-axis direction.

Each of the lower pillars DP and the upper pillars UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower pillar DP and the upper pillar UP may be electrically coupled through a pipe gate PG. The pipe gate PG may be disposed in the substrate 6311. For instance, the pipe gate PG may include the same material as the lower pillar DP and the upper pillar UP.

A doped material 6312 of a second type which extends in the x-axis direction and the y-axis direction may be provided over the lower pillars DP. For example, the doped material 6312 of the second type may include an n-type silicon material. The doped material 6312 of the second type may serve as a common source line CSL.

Drains 6340 may be provided over the upper pillars UP. The drains 6340 may include an n-type silicon material. First and second upper conductive materials 6351 and 6352 extending in the y-axis direction may be provided over the drains 6340.

The first and second upper conductive materials 6351 and 6352 may be separated in the x-axis direction. The first and second upper conductive materials 6351 and 6352 may be formed of a metal. The first and second upper conductive materials 6351 and 6352 and the drains 6340 may be electrically coupled through contact plugs. The first and second upper conductive materials 6351 and 6352 respectively serve as first and second bit lines BL1 and BL2.

The first conductive material 6321 may serve as a ground select line (i.e., a source select line), the second conductive material 6322 may serve as a first dummy word line, and the third and fourth conductive materials 6323 and 6324 serve as first and second main word lines, respectively. The fifth and sixth conductive materials 6325 and 6326 serve as third and fourth main word lines, respectively, the seventh conductive material 6327 may serve as a second dummy word line, and the eighth conductive material 6328 may serve as a drain select line (i.e., a string select line).

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string may be electrically coupled through the pipe gate PG. One end of the lower string may be electrically coupled to the doped material 6312 of the second type which serves as the common source line. One end of the upper string may be electrically coupled to a corresponding bit line through the drain 6340. One lower string and one upper string form one cell string which is electrically coupled between the doped material 6312 of the second type serving as the common source line and a corresponding one of the upper conductive material layers 6351 and 6352 serving as the bit line.

That is, the lower string may include a source select transistor, the first dummy memory cell, and the first and second main memory cells. The upper string may include the third and fourth main memory cells, the second dummy memory cell, and a drain select transistor.

In FIGS. 9 and 10, the upper string and the lower string may form a NAND string, and the NAND string may include a plurality of transistor structures. Since the transistor structure included in the NAND string in FIGS. 9 and 10 is described above in detail with reference to FIG. 7, a detailed description thereof will be omitted herein.

Figure 11:
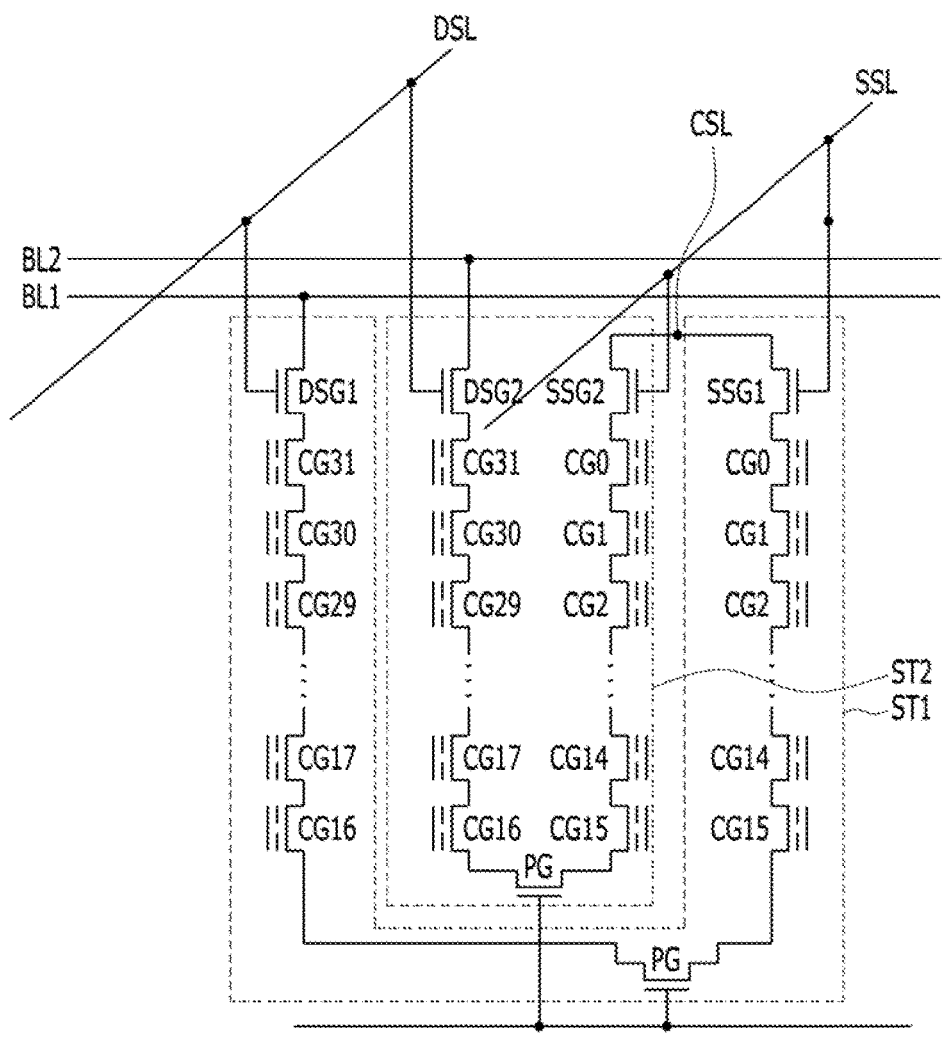

FIG. 11 is a circuit diagram illustrating of the memory block BLKj having the second structure as described above with reference to FIGS. 9 and 10. For the sake of convenience, only a first string and a second string, which form a pair in the memory block BLKj in the second structure are shown.

Referring to FIG. 11, in the memory block BLKj having the second structure among the plurality of blocks of the memory device 150, cell strings, each of which is implemented with one upper string and one lower string electrically coupled through the pipe gate PG as described above with reference to FIGS. 9 and 10, may be provided in such a way as to define a plurality of pairs.

Namely, in the certain memory block BLKj having the second structure, memory cells CG0 to CG31 stacked along a first channel (not shown), for example, at least one ground select gate (i.e., source select gate) GSG1 and at least one drain select gate (i.e., string select gate) DSG1 may form a first string ST1, and memory cells CG0 to CG31 stacked along a second channel (not shown), for example, at least one ground select gate GSG2 and at least one drain select gate DSG2 may form a second string ST2.

The first string ST1 and the second string ST2 may be electrically coupled to the same drain select line DSL and the same ground select line GSL. The first string ST1 may be electrically coupled to a first bit line BL1, and the second string ST2 may be electrically coupled to a second bit line BL2.

While it is described in FIG. 11 that the first string ST1 and the second string ST2 are electrically coupled to the same drain select line DSL and the same ground select line GSL, it may be envisaged that the first string ST1 and the second string ST2 may be electrically coupled to the same ground select line GSL and the same bit line, the first string ST1 may be electrically coupled to a first drain select line and the second string ST2 may be electrically coupled to a second drain select line. Further it may be envisaged that the first string ST1 and the second string ST2 may be electrically coupled to the same drain select line DSL and the same bit line, the first string ST1 may be electrically coupled to a first ground select line and the second string ST2 may be electrically coupled a second ground select line.

Figure 12:
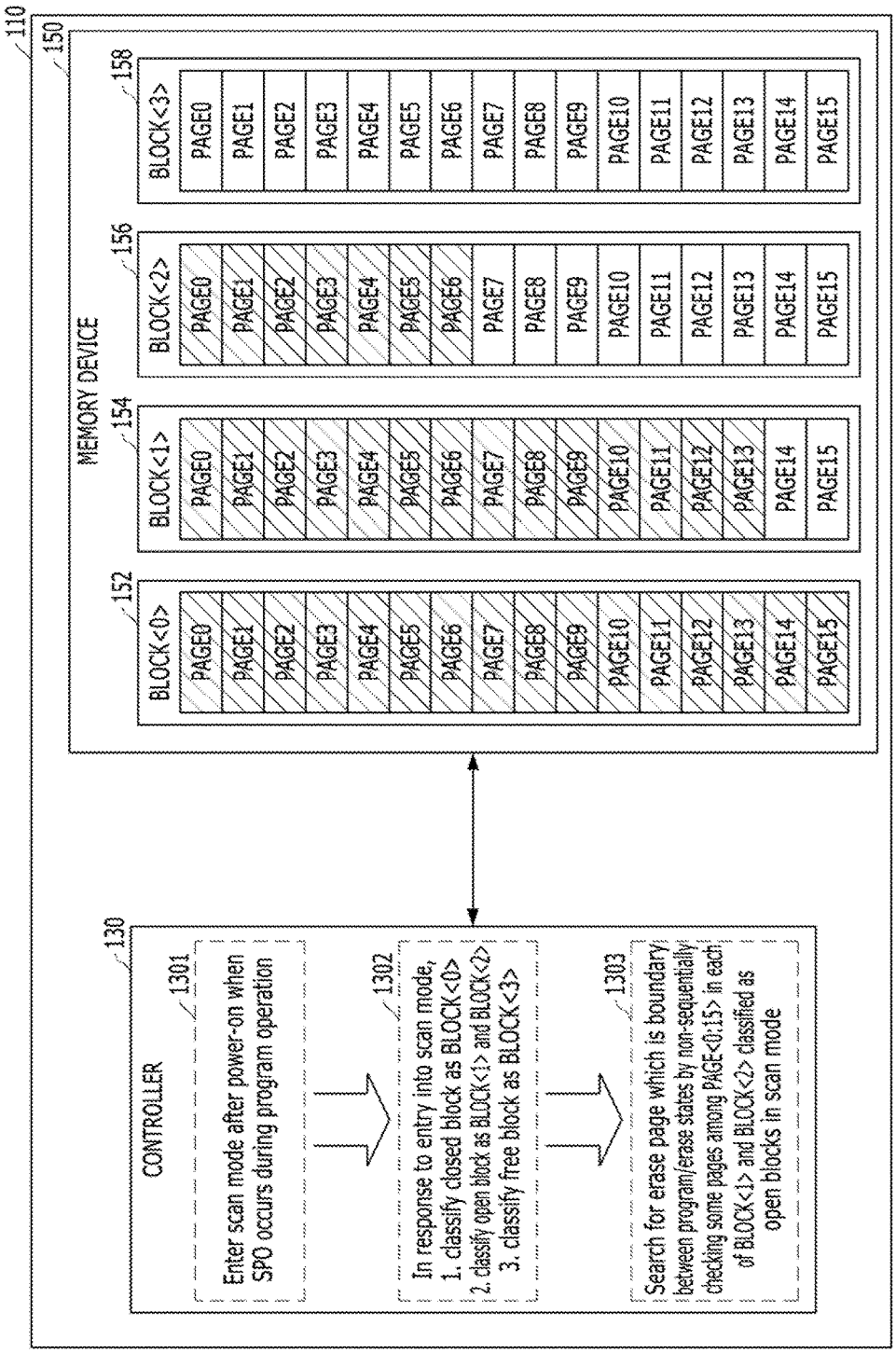
FIG. 12 is a block diagram illustrating a method of operating a memory system, according to an embodiment of the present invention.

FIG. 12 is a block diagram illustrating a method of operating a memory system, according to an embodiment of the present invention.

According to the embodiment of FIG. 12, the memory device 150 and the controller 130 are provided with reference to the configuration of the memory system 110 shown in FIG. 1.

The memory device 150 may include a plurality of memory blocks 152, 154, 156 and 158. More specifically, the memory device 150 may include a zeroth memory block BLOCK<0> 152, a first memory block BLOCK<1> 154, a second memory block BLOCK<2> 156, and a third memory block BLOCK<3> 158.

Each of the memory blocks 152, 154, 156 and 158 may include a plurality of pages, for example, pages PAGE<0:15>.

We note, that although, in the embodiment of the present invention, four memory blocks including the zeroth memory block BLOCK<0> 152, the first memory block BLOCK<1> 154, the second memory block BLOCK<2> 156, and the third memory block BLOCK<3> 158, are exemplified as the memory blocks 152, 154, 156 and 158 included in the memory device 150, the invention is not limited thereto and other embodiments may be readily envisaged by the skilled person wherein more or less memory blocks may be employed.

The controller 130 may control the memory device 150 in response to a request received from the host 102. For example, the controller 130 may provide data read from the memory device 150 to the host 102 and store data received from the host 102 in the memory device 150. For this, the controller 130 may control the operations of the memory device 150 including read, write (program), and erase operations, of the memory device 150.

A sudden power-off (SPO) in which a supply of a power source is suddenly shut off while the controller 130 controls a program operation of the memory device 150 may occur. For example, a SPO may occur while the controller 130 is programming data in the first and second memory blocks BLOCK<1> 154 and BLOCK<2> 156 of the memory device 150.

When connection with the power source is re-established, that is, the memory system is in a power-on state after an SPO occurrence, the controller 130 may first recognize the fact that the SPO occurred and proceed to perform the program operation of the memory device 150 which was interrupted by the SPO occurrence. For example, the controller 130 may proceed to program the data in the first and second memory blocks BLOCK<1> 154 and BLOCK<2> 156 of the memory device 150, which was in progress when the SPO occurred.

More specifically, to continue to perform the program operation of the memory device 150 which was in progress before the SPO occurred, the controller 130 may, in step 1301, enter a scan mode after power is re-established (i.e., after power-on) and start performing a scan operation on the memory blocks 152, 154, 156 and 158 included in the memory device 150 before performing the program operation.

The scan operation of the controller 130 includes checking the progress of the program operation performed before the SPO occurrence. For example, the scan operation of the controller 130 may check how many data among a plurality of data (not shown) inputted to the memory device 150 under the control of the controller 130 are programmed in the memory blocks 152, 154, 156 and 158 in actuality.

More specifically, for example, in response to an entry into the scan mode in step 1302, the controller 130 may classify the memory blocks 152, 154, 156 and 158 included in the memory device 150 into closed, open and or free blocks.

According to the example, illustrated in FIG. 12, the controller 130 may classify the zeroth memory block BLOCK<0> 152 as a closed block, the first memory block BLOCK<1> 154 and the second memory block BLOCK<2> 156 as open blocks, and the third memory block BLOCK<3> 158 as a free block.

In FIG. 12, a page filled with a solid line hatch pattern among the pages PAGE<0:15> included in each of the memory blocks 152, 154, 156 and 158 indicates that the page has been programmed with data. A page without a hatch pattern indicates a page not programmed with data. Accordingly, the zeroth memory block BLOCK<0> 152 where all the pages PAGE<0:15> are filled with the solid line hatch pattern may be classified as a closed block, i.e. a block having all its pages programmed with data. The first memory block BLOCK<1> 154 and the second memory block BLOCK<2> 156 where only some of their pages PAGE<0:15> are filled with the solid line hatch pattern, i.e., only some of their pages PAGE<0:15> are programmed with data, may be classified as open blocks. The third memory block BLOCK<3> 158 where all the pages PAGE<0:15> are not filled with the solid line pattern, i.e., all of its pages are nor programmed with data, may be classified as a free block.

The controller 130 may then perform a scan operation on the memory blocks classified as open blocks after classifying the memory blocks 152, 154, 156 and 158 included in the memory device 150 into closed, open, and free blocks (step 1302).

For example, the controller 130 may perform a scan operation on the first memory block BLOCK<1> 154 and the second memory block BLOCK<2> 156, which are classified as open blocks.

In the scan operation, in step 1303 the controller 130 may search for an erase page which is a boundary between program/erase states by non-sequentially checking some pages among the pages PAGE<0:15> in each of blocks BLOCK<1> and BLOCK<2> classified as open blocks in the scan mode. Hence, some of the pages included in a memory block classified as an open block may be non-sequentially selected and an erase state page which is a boundary between a program state and an erase state among the pages included in the memory block classified as the open block may be searched in step 1303.

For example, the controller 130, does not sequentially scan the pages PAGE<0:15> included in the first memory block BLOCK<1> 154 from the zeroth page PAGE0 in order to check the fourteenth page PAGE14 which is the erase state page among the pages PAGE<0:15> included in the first memory block BLOCK<1> 154 classified as an open block. Instead, a non-sequentially scanning of some of the pages PAGE<0:15> included in the first memory block BLOCK<1> 154 may be used.

Similarly, the controller 130 does not sequentially scan the pages PAGE<0:15> included in the second memory block BLOCK<2> 156 from the zeroth page PAGE0 in order to check the seventh page PAGE7 which is the erase state page among the pages PAGE<0:15> included in the second memory block BLOCK<2> 156 classified as an open block. Instead, a non-sequential scanning of some of the pages PAGE<0:15> included in the second memory block BLOCK<2> 156 may be used.

FIGS. 13A to 13F are diagrams illustrating scan mode operations performed by controller 130 in the memory system 110 of FIG. 12, according to an embodiment of the present invention.

Figure 13A:
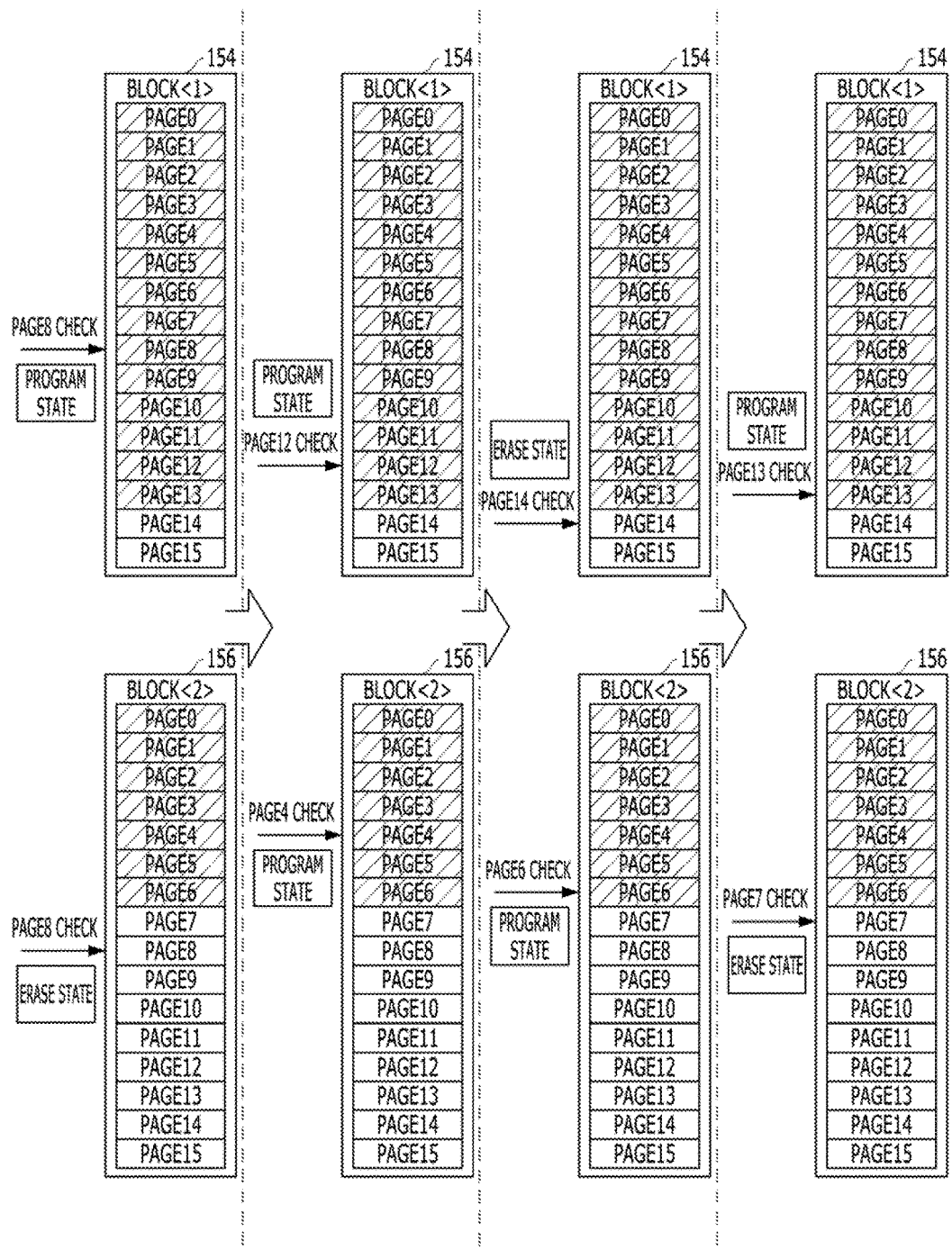
FIGS. 13A to 13F are diagrams illustrating scan mode operations performed by a controller in the memory system of FIG. 12, according to an embodiment of the present invention.

Referring to FIG. 13A, according to an embodiment of the present invention, the controller 130 performs a scan operation to search for the page which is the boundary page between the program state pages and the erase state pages in each of the first memory block BLOCK<1> 154 and the second memory block BLOCK<2> 156 included in the memory device 150 which were classified as open blocks upon entry into a scan mode.

More specifically, in the scan operation of the controller 130 shown in FIG. 13A, pages may be non-sequentially selected through a binary search between the zeroth page PAGE0 to the fifteenth page PAGE15 among the pages PAGE<0:15> included in each of the first memory block BLOCK<1> 154 and the second memory block BLOCK<2> 156, which are classified as open blocks, and the state of the selected pages may be checked. A state of a page may be a program state or an erase state.

In the scan operation of the controller 130 shown in FIG. 13A, when a page selected earlier and a page selected next among two pages that are consecutively selected between the number of pages set through the binary search are in an opposite state and physically continuous to each other, a page in the erase state among the page selected earlier and the page selected next may be selected as the erase state page which is the boundary page between the program state pages and the erase state pages in the open block.

In the scan operation of the controller 130 shown in FIG. 13A, when a page selected earlier and a page selected next among two pages that are consecutively selected between the number of pages set through the binary search are in an opposite state and physically discontinuous with each other, pages included between the page selected earlier and the page selected next may be sequentially selected through a linear search, and the selected pages may be checked.

For example, since it is assumed that the pages PAGE<0:15> included in the first memory block BLOCK<1> 154 include a total of 16 pages, a page selected first through the binary search in the first memory block BLOCK<1> 154 may be an eighth page PAGE8 disposed halfway between the starting page PAGE0 and the last page PAGE15. Accordingly, it may be seen that the eighth page PAGE8 is in the program state in the first memory block BLOCK<1> 154 as a result of checking the state of the eighth page PAGE8.

Since the eighth page PAGE8 of the first memory block BLOCK<1> 154 is in the program state, a page subsequently selected through the binary search in the first memory block BLOCK<1> 154 may be a twelfth page PAGE12 disposed halfway between the eighth page PAGE8 and the last page PAGE15. Accordingly, it may be seen that the twelfth page PAGE12 is in the program state in the first memory block BLOCK<1> 154 as a result of checking the state of the twelfth page PAGE12.

Since the twelfth page PAGE12 of the first memory block BLOCK<1> 154 is in the program state, a page subsequently selected through the binary search in the first memory block BLOCK<1> 154 may be a fourteenth page PAGE14 disposed halfway between the twelfth page PAGE12 and the last page PAGE15. Accordingly, it may be seen that the fourteenth page PAGE14 is in the erase state in the first memory block BLOCK<1> 154 as a result of checking the state of the fourteenth page PAGE14.

Checking that the fourteenth page PAGE14 of the first memory block BLOCK<1> 154 is in the erase state, it may be seen that the state of the fourteenth page PAGE14 is the opposite of the state of the twelfth page PAGE12 selected prior to the fourteenth page PAGE14, which is the program state.

In other words, it may be seen that two pages consecutively selected through the binary search are at opposite states. Specifically, the twelfth page PAGE 12 and the fourteenth page PAGE 14 which were consecutively selected through the binary search in the example of FIG. 13A are at opposite states. Specifically, twelfth page PAGE12 selected earlier is in the program state and the fourteenth page PAGE14 which was selected next is in the erase state.

Therefore, the controller 130 may check whether or not the number of page intervals between the twelfth page PAGE12 and the fourteenth page PAGE14 which were consecutively selected through the binary search are equal to or less than a predetermined number of page intervals. When the page of intervals is only 1 then the two consecutively selected pages are physically continuous to each other. According to the result of the checking of the number of page intervals between the two consecutively selected pages, the controller 130 may select whether to continue to use the binary search, change to a linear search, or terminate the search.

As an example, let us assume that the predetermined number of page intervals is three (3). In this case, according to the example illustrated in FIG. 13A, page intervals between the twelfth page PAGE12 and the fourteenth page PAGE14 which were consecutively selected through the binary search is two (2) which is less than three (3) which is the predetermined number of page intervals. Moreover, the twelfth page PAGE12 and the fourteenth page PAGE14 may not be physically continuous to each other because the number of page intervals between these two pages is two, i.e., not equal to one (1). Obviously, if the number of page intervals between two consecutively selected pages is equal to one (1) then the two consecutively selected pages are physically continuous. Accordingly, in the example of the two consecutively selected pages PAGE 12 and PAGE 14, the scanning mode will terminate the binary search mode and employ the linear search for continuing the scanning.

A page selected subsequent to the fourteenth page PAGE14 in the first memory block BLOCK<1> 154 may be a thirteenth page PAGE13 through the linear search. Accordingly, it may be seen that the thirteenth page PAGE13 is in the program state in the first memory block BLOCK<1> 154 as a result of checking the program/erase state of the thirteenth page PAGE13.

Checking that the thirteenth page PAGE13 of the first memory block BLOCK<1> 154 is in the program state, it may be seen that the state of the thirteenth page PAGE13 is the opposite of the state of the fourteenth page PAGE14 selected prior to the thirteenth page PAGE13, which is in the erase state. Moreover, it may be checked that the number of page intervals between the two consecutively selected pages, namely the fourteenth page PAGE14 and the thirteenth page PAGE13 is equal to one (1). Therefore, the fourteenth page PAGE14 and the thirteenth page PAGE13 may be identified as being physically continuous to each other. Accordingly, the search may be terminated, and it may be checked that the fourteenth page PAGE14 is the erase page of the first memory block BLOCK<1> 154, which is the boundary between the program state pages and the erase state pages of the open block BLOCK<1>.

Since it is assumed in the Illustrated example, that the pages PAGE<0:15> included in the second memory block BLOCK<2> 156 include a total of 16 pages, a page selected first through the binary search in the second memory block BLOCK<2> 156 may be an eighth page PAGE8 disposed halfway between the starting page PAGE0 and the last page PAGE15. Accordingly, it may be seen that the eighth page PAGE8 is in the erase state in the second memory block BLOCK<2> 156 as a result of checking the program/erase state of the eighth page PAGE8.

Since the eighth page PAGE8 of the second memory block BLOCK<2> 156 is in the erase state, a page subsequently selected through the binary search in the second memory block BLOCK<2> 156 may be a fourth page PAGE4 disposed halfway between the starting page PAGE0 and the eighth page PAGE8. Accordingly, it may be seen that the fourth page PAGE4 is in the program state in the second memory block BLOCK<2> 156 as a result of checking the program/erase state of the fourth page PAGE4.

Checking that the fourth page PAGE4 of the second memory block BLOCK<2> 156 is in the program state, it may be seen that the state of the fourth page PAGE4 is the opposite of the state of the eighth page PAGE8 selected prior to the fourth page PAGE4, which is the erase state.

In other words, it may be seen that the two pages consecutively selected through the binary search are at opposite states because the eighth page PAGE8 selected earlier is in the erase state and the fourth page PAGE4 selected next is in the program state.

Therefore, the controller 130 may check whether the page intervals between the eighth page PAGE8 and the fourth page PAGE4, which were consecutively selected through the binary search and which are at opposite states, are included within the predetermined number of page intervals. According to the result of checking, the controller 130 may select whether to continue to use the binary search, change to the linear search, or terminate the search.

It may be assumed that the predetermined number of page intervals is three (3). In this case, the page intervals between the eighth page PAGE8 and the fourth page PAGE4 which were consecutively selected through the binary search is four (4) which is not equal to or less than the predetermined number of page intervals. Accordingly, the binary search may continue to be used.

A page selected subsequent to the fourth page PAGE4 through the binary search in the second memory block BLOCK<2> 156 may be a sixth page PAGE6 disposed halfway between the fourth page PAGE4 and the eighth page PAGE8. Accordingly, it may be seen that the sixth page PAGE6 is in the program state in the second memory block BLOCK<2> 156 as a result of checking the program/erase state of the sixth page PAGE6.

Since the sixth page PAGE6 of the second memory block BLOCK<2> 156 is in the program state, a page subsequently selected through the binary search in the second memory block BLOCK<2> 156 may be a seventh page PAGE7 disposed halfway between the sixth page PAGE6 and the eighth page PAGE8. Accordingly, it may be seen that the seventh page PAGE7 is in the erase state in the second memory block BLOCK<2> 156 as a result of checking the program/erase state of the seventh page PAGE7.

Checking that the seventh page PAGE7 of the second memory block BLOCK<2>, 156 is in the erase state, it may be seen that the state of the seventh page PAGE7 is the opposite of the state of the sixth page PAGE6 selected prior to the seventh page PAGE7, which is in the program state.

In other words, it may be seen that two pages consecutively selected through the binary search at an opposite state because the sixth page PAGE6 selected earlier is in the program state and the seventh page PAGE7 selected next is in the erase state.

Therefore, the controller 130 may check whether the sixth page PAGE6 and the seventh page PAGE7 consecutively selected through the binary search are included within the predetermined number of page intervals and whether they are physically continuous to each other. According to a result of checking, the controller 130 may select whether to continue to use the binary search, change to the linear search, or terminate the search.

It may be assumed that the predetermined number of page intervals is equal to or less than 3. In this case, the sixth page PAGE6 and the seventh page PAGE7 consecutively selected through the binary search may be within the predetermined number of page intervals because they are at an interval of one page. Moreover, the sixth page PAGE6 and the seventh page PAGE7 are physically continuous to each other because there is only one page interval between them. Accordingly, the search may be terminated, and it may be checked that the seventh page PAGE7 is the erase page of the second memory block BLOCK<2> 156, which is the boundary page between the program state pages and the erase state pages.

In the scan operation of the controller 130 shown in FIG. 13A, when the erase page, which is the boundary page between the program state pages and the erase state pages, is searched between the starting page PAGE0 and the last page PAGE15 among the pages PAGE<0:15> included in each of the first memory block BLOCK<1> 154 and the second memory block BLOCK<2> 156 which are open blocks, a binary search may be used first which selects in non-sequential manner pages. Therefore, even though the selected pages are only a portion of the total number of pages PAGE<0:15> in an open block, the program/erase state of the selected pages may be checked, and subsequently it is possible to search and identify the erase boundary page, i.e., the erase page in the open block which is the boundary page between the program state pages and the erase state pages.

Figure 13B:
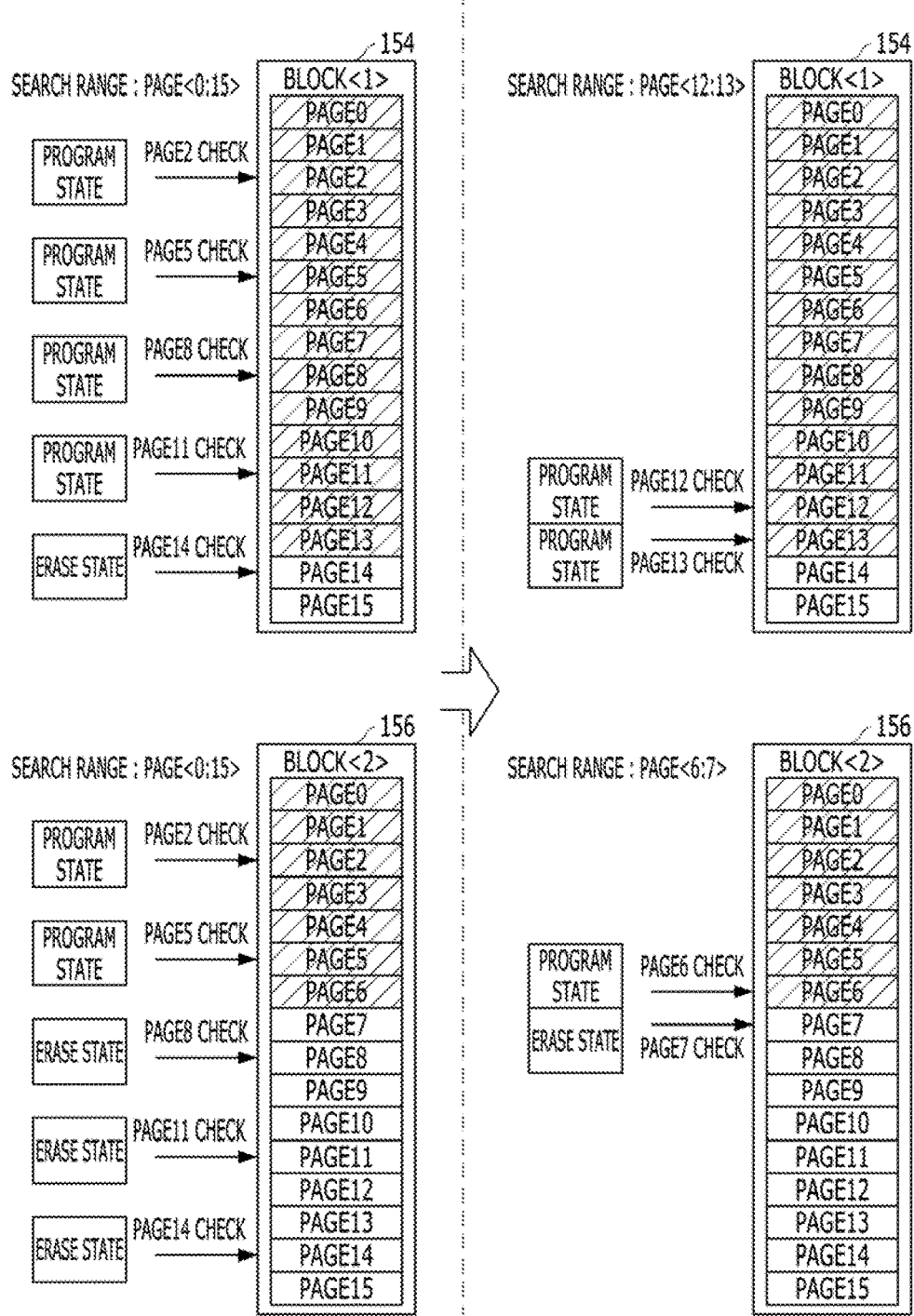

Referring now to FIG. 13B, another embodiment of the present invention is provided wherein the controller 130 performs a scan operation for searching for the page which is the boundary page between the program state pages and the erase state pages in each of the first memory block BLOCK<1> 154 and the second memory block BLOCK<2> 156 included in the memory device 150.

More specifically In the scan operation of the controller 130 shown in FIG. 13B, one page may be selected for each interval of K pages obtained by dividing the total number of pages included in a search range by N, and the states of the selected pages may be checked. The total number of pages included in the open block may be set as the search range.

A range set operation in the scan operation of the controller 130 shown in FIG. 13B may be an operation to select one page for each interval of K pages obtained by dividing the total number of pages included in the search range by N, checking the program/erase states of the selected pages, and then, setting again (K−1) pages included between two pages, which are at an opposite state, as the search range.

In the scan operation of the controller 130 shown in FIG. 13B, the (K−1) pages included in the search range set through the range set operation may be sequentially selected through a linear search, and the states of the selected pages may be checked.

For example, it may be assumed that the pages PAGE<0:15> included in the first memory block BLOCK<1> 154 include a total of 16 pages. The search range may thus be the total of 16 pages which are the entire number pages PAGE<0:15> included in the first memory block BLOCK<1> 154. It may be assumed that N is 5. In this case, the value of K is obtained by dividing the total number of pages, i.e., 16 by 5 which gives a quotient of 3. That is, K is set equal to the quotient obtained by dividing the total number of pages by N.

Therefore, the controller 130 may select one page for each interval of three pages based on the starting page PAGE0 among the pages PAGE<0:15> included in the first memory block BLOCK<1> 154 and check the states of the selected pages. In other words, the controller 130 may select a second page PAGE2, a fifth page PAGE5, an eighth page PAGE8, an eleventh page PAGE11 and a fourteenth page PAGE14 among the pages PAGE<0:15> included in the first memory block BLOCK<1> 154 and check the states of the selected pages.

Consequently, it may be seen that the second page PAGE2, the fifth page PAGE5, the eighth page PAGE8, and the eleventh page PAGE11 of the first memory block BLOCK<1> 154 are all in the program state, whereas the fourteenth page PAGE14 of the first memory block BLOCK<1> 154 is in the erase state.

The range set operation to reset a search range may be performed to include two pages which are (K−1) pages based on the result of checking of the states of the selected pages the state of each of the five pages PAGE2, PAGE5, PAGE8, PAGE11 and PAGE14 among the pages PAGE<0:15> included in the first memory block BLOCK<1> 154. In other words, although the entire number of pages PAGE<0:15> included in the first memory block BLOCK<1> 154 are included in the search range before the range set operation is performed, just two pages may be reset to be included in the search range after the range set operation is performed.

The range set operation may reset two pages, which are (K−1) pages, included between two pages, which are at an opposite state, as the search range based on the result of checking of the states of the selected pages the state of each of the five pages PAGE2, PAGE5, PAGE8, PAGE11 and PAGE14 among the pages PAGE<0:15> included in the first memory block BLOCK<1> 154. The eleventh page PAGE11 may be in the program state, and the fourteenth page PAGE14 may be in the erase state. Accordingly, a twelfth page PAGE12 and a thirteenth page PAGE13 which are two pages included between the eleventh page PAGE11 and the fourteenth page PAGE14 may be reset as the search range through the range set operation.

The (K−1) pages, i.e., the two pages in the example of FIG. 13B, included in the search range that is reset through the range set operation may be sequentially selected through the linear search, and the states of the selected pages may be checked. For example, as shown in FIG. 13B, two pages included in the search range that is reset through the range set operation may be sequentially selected through the linear search, and the state of the selected pages may be checked. In other words, the twelfth page PAGE12 and the thirteenth page PAGE13 which are two pages included between the eleventh page PAGE11 and the fourteenth page PAGE14 may be reset as the search range through the range set operation, and the twelfth page PAGE12 and the thirteenth page PAGE13 may be sequentially checked through the linear search. As a result, it may be seen that the twelfth page PAGE12 is in the program state, and the thirteenth page PAGE13 is in the program state. While the search range is reset and the states of the pages included in the reset search range are checked through the linear search, the states of the pages, i.e., the thirteenth page PAGE13 and the fourteenth page PAGE14, which are the boundary page between the program state pages and the erase state pages in the first memory block BLOCK<1> 154, may be checked. Accordingly, it may be seen that the erase page which is the boundary page between the program state pages and the erase state pages in the first memory block BLOCK<1> 154 is the fourteenth page PAGE14.

It may be assumed that the pages PAGE<0:15> included in the second memory block BLOCK<2> 156 include a total of 16 pages. The search range may be the total 16 pages which are the entire pages PAGE<0:15> included in the second memory block BLOCK<2> 156. It may be assumed that N is 5. In this case, the K value obtained by dividing the total 16 pages by 5 may also be 3. As mentioned above, K is the quotient obtained by dividing the total number of pages by N.

Therefore, the controller 130 may select one page for each interval of three pages based on the starting page PAGE0 among the pages PAGE<0:15> included in the second memory block BLOCK<2> 156 and check the states of the selected pages. In other words, the controller 130 may select a second page PAGE2, a fifth page PAGE5, an eighth page PAGE8, an eleventh page PAGE11 and a fourteenth page PAGE14 among the pages PAGE<0:15> included in the second memory block BLOCK<2> 156 and check the states of the selected pages.

Consequently, it may be seen that the second page PAGE2 of the second memory block BLOCK<2> 156 is in the program state, the fifth page PAGE5 is in the program state, the eighth page PAGE8 is in the erase state, the eleventh page PAGE11 is in the erase state and the fourteenth page PAGE14 is in the erase state.

The range set operation to reset a search range may be performed to include (K−1) pages, i.e., two pages based on the result of checking of the states of the selected pages the state of each of the five pages PAGE2, PAGE5, PAGE8, PAGE11 and PAGE14 among the pages PAGE<0:15> included in the second memory block BLOCK<2> 156. In other words, although the entire pages PAGE<0:15> included in the second memory block BLOCK<2> 156 are included in the search range before the range set operation is performed, just two pages may be reset to be included in the search range after the range set operation is performed.

The range set operation may reset two pages, which are (K−1) pages, included between two pages, which are at an opposite state, as the search range based on the result of checking of the states of the selected pages the state of each of the five pages PAGE2, PAGE5, PAGE8, PAGE11 and PAGE14 among the pages PAGE<0:15> included in the second memory block BLOCK<2> 156. The fifth page PAGE5 may be in the program state, and the eighth page PAGE8 may be in the erase state. Accordingly, a sixth page PAGE6 and a seventh page PAGE7 which are two pages included between the fifth page PAGE5 and the eighth page PAGE8 may be reset as the search range through the range set operation.

The (K−1) pages included in the search range that is reset through the range set operation may be sequentially selected through the linear search, and the states of the selected pages may be checked. For example, as shown in FIG. 13B, two pages included in the search range that is reset through the range set operation may be sequentially selected through the linear search, and the state of the selected pages may be checked. In other words, the sixth page PAGE6 and the seventh page PAGE7 which are two pages included between the fifth page PAGE5 and the eighth page PAGE8 may be reset as the search range through the range set operation, and the sixth page PAGE6 and the seventh page PAGE7 may be sequentially checked through the linear search. As a result, it may be seen that the sixth page PAGE6 is in the program state, and the seventh page PAGE7 is in the erase state. While the search range is reset and the states of the pages included in the reset search range are checked through the linear search, the states of the pages, i.e., the sixth page PAGE6 and the seventh page PAGE7, which are the boundary between the program state pages and the erase state pages in the second memory block BLOCK<2> 156, may be checked. Accordingly, it may be seen that the erase page which is the boundary page between the program state pages and the erase state pages in the second memory block BLOCK<2> 156 is the seventh page PAGE7.

In the scan operation of the controller 130 shown in FIG. 13B, pages may be non-sequentially selected through a method selecting one page for each interval of K pages obtained by dividing the entire pages included in the search range by N. Therefore, even though the selected pages are just a portion of the pages PAGE<0:15>, the program/erase state of the selected pages may be checked, and subsequently it is possible to search for and identify the erase page which is the boundary page between the program state pages and the erase state pages.

Figure 13C:
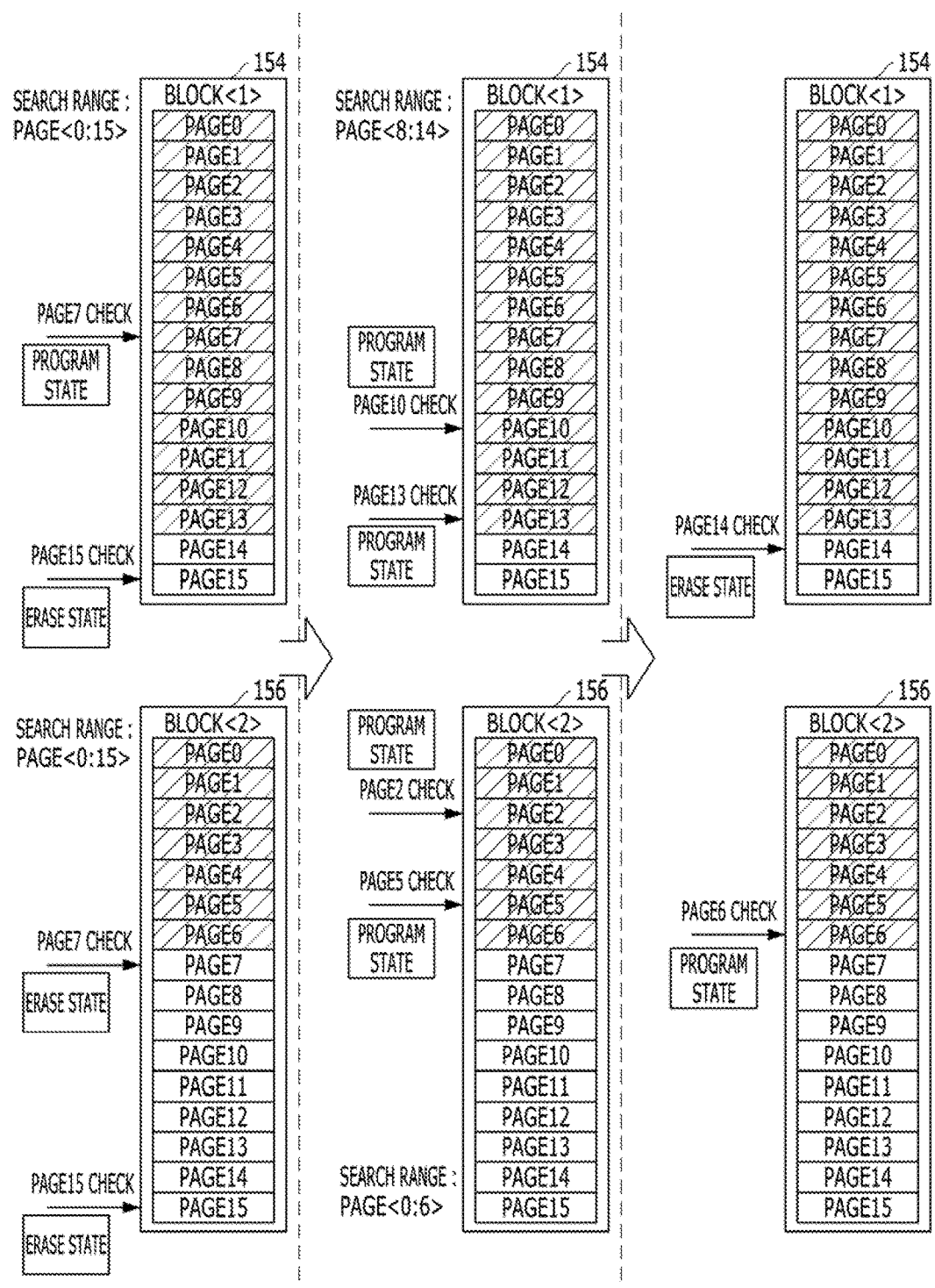

Referring to FIG. 13C, according to an embodiment of the present invention, the controller 130 performs the scan operation to search for the page which is the boundary page between the program state pages and the erase state pages in each of the first memory block BLOCK<1> 154 and the second memory block BLOCK<2> 156 included in the memory device 150.

More specifically, in the scan operation of the controller 130 shown in FIG. 13C, one page may be selected for each interval of K pages obtained by dividing total number of pages included in a search range by N, and the states of the selected pages may be checked. Based on the result of checking of the states of the selected pages, a range set operation to reset the search range to include (K−1) pages may be repeatedly performed until the number of the (K−1) pages is less than the predetermined number of pages. The total number of pages included in the open block at the beginning of the scan operation may be set as the search range.

A range set operation in the scan operation of the controller 130 shown in FIG. 13C may include selecting one page for each interval of K pages obtained by dividing the total pages included in the search range by N, checking the program/erase states of the selected pages and then, re-setting (K−1) pages included between two pages, which are at an opposite state, as the new search range. Then, the selecting, checking and re-setting steps may be repeated the number of the (K−1) pages is less than the predetermined number of pages. In an embodiment, the predetermined number of pages may be three (3).

In the scan operation of the controller 130 shown in FIG. 13C, when the number of the (K−1) pages is less than the predetermined number of pages through the range set operation, the (K−1) pages included in the search range may be sequentially selected through a linear search, and the states of the selected pages may be checked.

For example, it may be assumed that the pages PAGE<0:15> included in the first memory block BLOCK<1> 154 include a total of 16 pages. The search range of an initial operation may be the total number of 16 pages which are the entire number of pages PAGE<0:15> included in the first memory block BLOCK<1> 154. It may be assumed in the illustrated embodiment of FIG. 13C that N is 2. In this case, K obtained by dividing the total 16 pages by 2 may be 8. That is, K is a quotient obtained by dividing the total number of pages by N.

Therefore, the controller 130 may select one page for each interval of eight pages based on the starting page PAGE0 among the pages PAGE<0:15> included in the first memory block BLOCK<1> 154 and check the states of the selected pages. In other words, the controller 130 may select a seventh page PAGE7 and a fifteenth page PAGE15 among the pages PAGE<0:15> included in the first memory block BLOCK<1> 154 and check the states of the selected pages.

Consequently, it may be seen that the seventh page PAGE7 of the first memory block BLOCK<1> 154 is in the program state, and the fifteenth page PAGE15 is in the erase state.

The range set operation to reset the search range may be performed to include seven pages which are (K−1) pages based on a result of checking the state of each of the two pages PAGE7 and PAGE15 among the pages PAGE<0:15> included in the first memory block BLOCK<1> 154. In other words, although all the pages PAGE<0:15> included in the first memory block BLOCK<1> 154 are included in the search range before the range set operation is performed, just seven pages may be reset to be included in the search range after the range set operation is performed.

The range set operation may reset seven pages, which are (K−1) pages, included between two pages, which are at an opposite state, as the search range based on a result of checking the state of each of the two pages PAGE7 and PAGE15 among the pages PAGE<0:15> included in the first memory block BLOCK<1> 154. The seventh page PAGE7 may be in the program state, and the fifteenth page PAGE15 may be in the erase state. Accordingly, an eighth page PAGE8, a ninth page PAGE9, a tenth page PAGE10, an eleventh page PAGE11, a twelfth page PAGE12 and a thirteenth page PAGE13 which are seven pages included between the seventh page PAGE7 and the fifteenth page PAGE15 may be reset as the search range through the range set operation.

When the search range is reset through the range set operation, it may be checked whether (K−1) which is the number of the pages included in the reset search range is less than the predetermined number of pages.

When the (K−1) number of the pages included in the search range reset through the range set operation is greater than the predetermined number of pages, a value of K may be reset by dividing the (K−1) pages included in the search range reset through the range set operation by N. For example, as shown in FIG. 13C, when the (K−1) number of the pages included in the reset search range is 7, it may be assumed that the predetermined number of pages is 3. In other words, the number of the pages included in the reset search range is greater than the predetermined number of pages.

Accordingly, the controller 130 may reset the value of K as 3 by dividing seven pages included in the reset search range by 2 which is N. That is, the value of K as 3 is a quotient obtained by dividing 7 by 2. For example, the controller 130 may select one page for each interval of three pages based on the eighth page PAGE8 which is a first page among the eighth to fourteenth pages PAGE<8:14> included in the reset search range among the pages PAGE<0:15> included in the first memory block BLOCK<1> 154 and check the states of the selected pages. That is, the controller 130 may select the tenth page PAGE10 and the thirteenth page PAGE13 among the eighth to fourteenth pages PAGE<8:14> included in the reset search range among the pages PAGE<0:15> included in the first memory block BLOCK<1> 154 and check the state of each of the selected pages.

Consequently, it may be checked that the tenth page PAGE10 included in the first memory block BLOCK<1> 154 is in the program state, and the thirteenth page PAGE13 is in the program state.

The range set operation to reset the search range may be performed to include two pages which are (K−1) pages based on a result of checking the state of each of the two pages PAGE10 and PAGE13 among the eighth to fourteenth pages PAGE<8:14> included in the reset search range included in the first memory block BLOCK<1> 154.

It may be seen that the states of two pages PAGE10 and PAGE13 among the eighth to fourteenth pages PAGE<8:14> included in the reset search range included in the first memory block BLOCK<1> 154 are in the program states. That is, the two pages PAGE10 and PAGE13 are not in opposite states. However, it may be inferred from the program states of the two pages PAGE10 and PAGE13 among the eighth to fourteenth pages PAGE<8:14> included in the reset search range included in the first memory block BLOCK<1> 154 that the address of the page in the erase state is greater than the address of the thirteenth page PAGE13. In addition, it may be seen that the fifteenth page PAGE15 is in the erase state based on the results of the initial search range.

Accordingly, the reset search range based on the result of checking the states of the two pages PAGE10 and PAGE13 among the eighth to fourteenth pages PAGE<8:14> included in the reset search range included in the first memory block BLOCK<1> 154 may be the fourteenth page PAGE14. The address of the fourteenth page PAGE14 is greater than that of the thirteenth page PAGE13 and is less than that of the fifteenth page PAGE15 that is previously checked. In other words, the reset search range based on the result of checking the states of the two pages PAGE10 and PAGE13 among the eighth to fourteenth pages PAGE<8:14> included in the reset search range included in the first memory block BLOCK<1> 154 may be one page which is less than the predetermined number '3' of pages. Hence, as shown in FIG. 13C, it may be seen that the fourteenth page PAGE14 is in the erase state as a result of checking the state of the fourteenth page PAGE14.

While the search range is reset and the states of the pages included in the reset search range are checked and the search range is reset until the number of the pages included in the search range becomes equal to or less than the predetermined number of pages based on the result of checking of the states of the selected pages, the states of the pages, i.e., the thirteenth page PAGE13 and the fourteenth page PAGE14, which are the boundary page between the program state pages and the erase state pages in the first memory block BLOCK<1> 154, may be checked. Accordingly, it may be seen that the erase page which is the boundary page between the program state pages and the erase state pages in the first memory block BLOCK<1> 154 is the fourteenth page PAGE14.

It may be assumed that the pages PAGE<0:15> included in the second memory block BLOCK<2> 156 include a total of 16 pages. The search range of an initial operation may be the total 16 pages which are the entire pages PAGE<0:15> included in the second memory block BLOCK<2> 156. It may be assumed that N is 2. In this case, K obtained by dividing the total 16 pages by 2 may be 8.

Therefore, the controller 130 may select one page for each interval of eight pages based on the starting page PAGE0 among the pages PAGE<0:15> included in the second memory block BLOCK<2> 156 and check the states of the selected pages. In other words, the controller 130 may select a seventh page PAGE7 and a fifteenth page PAGE15 among the pages PAGE<0:15> included in the second memory block BLOCK<2> 156 and check the states of the selected pages.

Consequently, it may be seen that the seventh page PAGE7 of the second memory block BLOCK<2> 156 is in the erase state, and the fifteenth page PAGE15 is in the erase state.

The range set operation to reset the search range may be performed to include (K−1) pages, i.e., seven (7) pages based on a result of checking the state of each of the two pages PAGE7 and PAGE 15 among the pages PAGE<0:15> included in the second memory block BLOCK<2> 156. In other words, although all the pages PAGE<0:15> included in the second memory block BLOCK<2> 156 are included in the search range before the range set operation is performed, just seven pages may be reset to be included in the search range after the range set operation is performed.

The range set operation may reset seven pages, which are (K−1) pages, included between two pages, which are at an opposite state, as the search range based on a result of checking the state of each of the two pages PAGE7 and PAGE15 among the pages PAGE<0:15> Included in the second memory block BLOCK<2> 156. The seventh page PAGE7 and the fifteenth page PAGE15 may be in the erase state. However, it may be inferred from the erase states of the seventh page PAGE7 and the fifteenth page PAGE15 that the address of the page in the program state is less than that of the seventh page PAGE7.

The search range reset through the range set operation based on the result of checking the state of each of the two pages PAGE7 and PAGE15 among the pages PAGE<0:15> included in the second memory block BLOCK<2> 156 may be seven pages with lower addresses, i.e., the zeroth page PAGE0, a first page PAGE1, a second page PAGE2, a third page PAGE3, a fourth page PAGE4, a fifth page PAGE5 and a sixth page PAGE6.

When the search range is reset through the range set operation, it may be checked whether (K−1) which is the number of the pages included in the reset search range is less than the predetermined number of pages.

When the (K−1) which is the number of the pages included in the search range reset through the range set operation is greater than the predetermined number of pages, a value of K may be reset by dividing the (K−1) pages included in the search range reset through the range set operation by N. For example, as shown in FIG. 13C, when the (K−1) which is the number of the pages included in the reset search range is 7, it may be assumed that the predetermined number of pages is 3. In other words, it may be assumed that the number of the pages included in the reset search range is greater than the predetermined number of pages.

Accordingly, the controller 130 may reset the value of K as 3 by dividing seven pages included in the reset search range by 2 which is N. The value of K is a quotient obtained by dividing 7 by 2. For example, the controller 130 may select one page for each interval of three pages based on the zeroth page PAGE0 which is a first page among the zeroth to sixth pages PAGE<0:6> included in the reset search range among the pages PAGE<0:15> included in the second memory block BLOCK<2> 156 and check the states of the selected pages. That is, the controller 130 may select the second page PAGE2 and the fifth page PAGE5 among the zeroth to sixth pages PAGE<0:6> Included in the reset search range among the pages PAGE<0:15> included in the second memory block BLOCK<2> 156 and check the state of each of the selected pages.

Consequently, it may be checked that the second page PAGE2 and the fifth page PAGE5 included in the second memory block BLOCK<2> 156 are both in the program state.

The range set operation to reset the search range may be performed to include two pages which are (K−1) pages based on a result of checking the state of each of the two pages PAGE2 and PAGE5 among the zeroth to sixth pages PAGE<0:6> included in the reset search range included in the second memory block BLOCK<2> 156.

It may be seen that the states of two pages PAGE2 and PAGE5 among the zeroth to sixth pages PAGE<0:6> included in the reset search range included in the second memory block BLOCK<2> 156 are in the program states. That is, the two pages PAGE2 and PAGE5 are not in opposite states. However, it may be inferred from the program states of the two pages PAGE2 and PAGE5 among the zeroth to sixth pages PAGE<0:6> included in the reset search range included in the second memory block BLOCK<2> 156 that the address of the page in the erase state is greater than that of the fifth page PAGE5. In addition, it may be seen that the seventh page PAGE7 is in the erase state based in the Initial search range.

Accordingly, the reset search range based on a result of checking the states of the two pages PAGE2 and PAGE5 among the zeroth to sixth pages PAGE<0:6> included in the reset search range included in the second memory block BLOCK<2> 156 may be the sixth page PAGE6. The address of the sixth page PAGE6 is greater than that of the fifth page PAGE5 and is less than the seventh page PAGE7 that is previously checked. In other words, the reset search range based on the result of checking the states of the two pages PAGE2 and PAGE5 among the zeroth to sixth pages PAGE<0:6> included in the reset search range included in the second memory block BLOCK<2> 156 may be one page which is smaller than the predetermined number '3' of pages. Hence, as shown in FIG. 13C, it may be seen that the sixth page PAGE6 is in the program state as a result of checking the state of the sixth page PAGE6.

While the search range is reset and the states of the pages included in the reset search range are checked and the search range is reset again until the number of the pages included in the search range becomes equal to or less than the predetermined number of pages based on a result of checking, the states of the pages, i.e., the sixth page PAGE6 and the seventh page PAGE7, which are the boundary between the program state pages and the erase state pages in the second memory block BLOCK<2> 156, may be checked. Accordingly, it may be seen that the erase page which is the boundary page between the program state pages and the erase state pages in the second memory block BLOCK<2> 156 is the seventh page PAGE7.

In the scan operation of the controller 130 shown in FIG. 13C, pages may be non-sequentially selected through a method selecting one page for each interval of K pages obtained by dividing the entire pages included in the search range by N. Therefore, even though the selected pages are just a portion of the pages PAGE<0:15>, the program/erase state of the selected pages may be checked, and subsequently it is possible to search and identify the erase page which is the boundary page between the program state pages and the erase state pages.

Since the range set operation to reset the search range to include (K−1) pages is used when the pages PAGE<0:15> included in each of the first memory block BLOCK<1> 154 and the second memory block BLOCK<2> 156 which are open blocks are set as the initial search range and (K−1) is greater than the predetermined number of pages, the number of pages that are directly selected and checked among the pages PAGE<0:15> included in each of the first memory block BLOCK<1> 154 and the second memory block BLOCK<2> 156 may be greatly reduced.

Figure 13D:
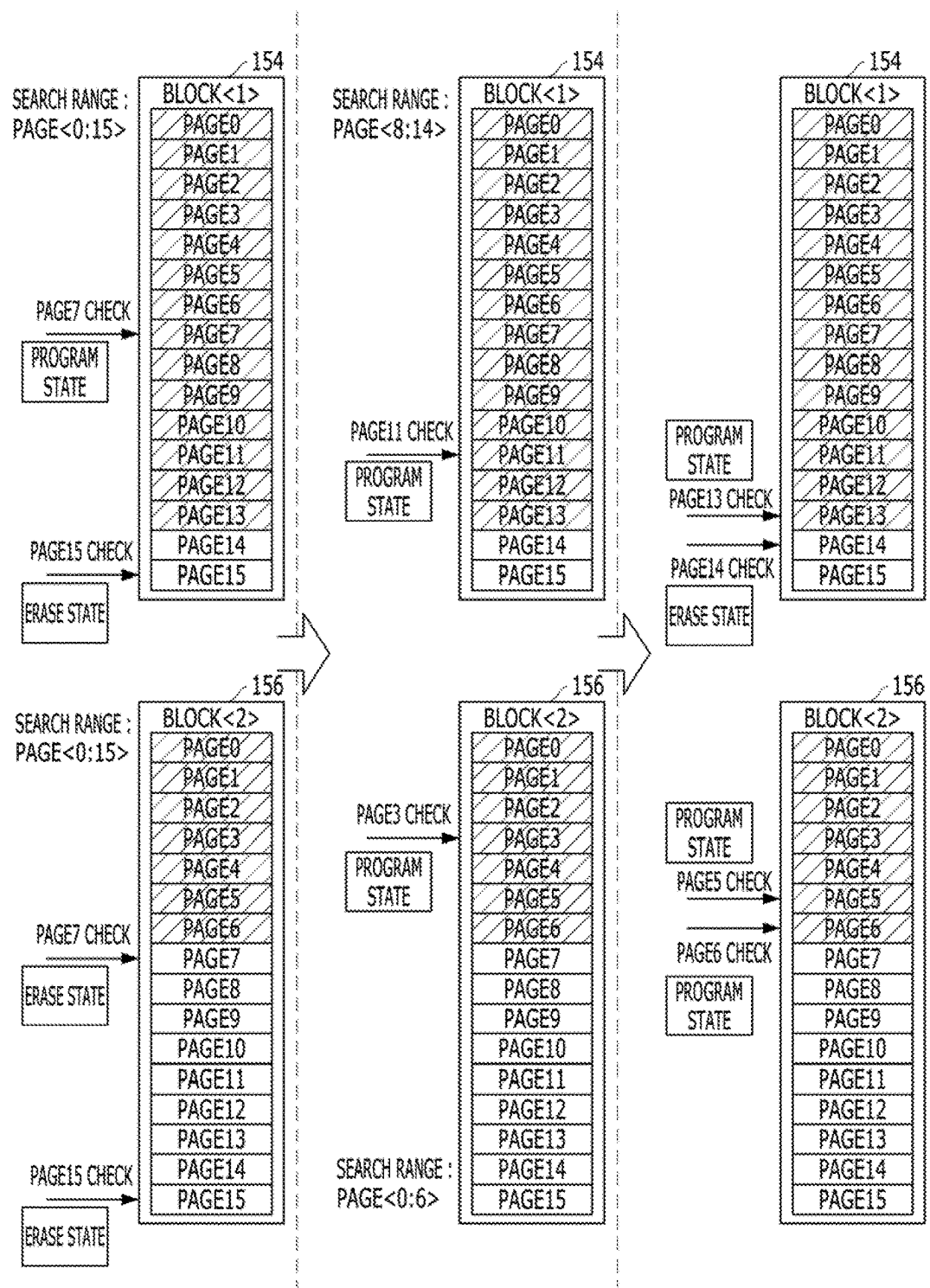

Referring to FIG. 13D, according to an embodiment of the present invention, the controller 130 performs the scan operation to search for the page which is the boundary page between the program state pages and the erase state pages in each of the first memory block BLOCK<1> 154 and the second memory block BLOCK<2> 156 included in the memory device 150.

More specifically, in the scan operation of the controller 130 shown in FIG. 13D, one page may be selected for each interval of K pages obtained by dividing total number of pages included in a search range by N, and the states of the selected pages may be checked. The total pages included in the open block may be set as the search range.

A range set operation in the scan operation of the controller 130 shown in FIG. 13D may be an operation to select one page for each interval of K pages obtained by dividing the total pages included in the search range by N and check program/erase states of the selected pages and then, set again (K−1) pages included between two pages, which at an opposite state, as the search range.

In the scan operation of the controller 130 shown in FIG. 13D, the (K−1) pages included in the search range reset through the range set operation may be non-sequentially selected through a binary search, and the states of the selected pages may be checked.

For example, it may be assumed that the pages PAGE<0:15> included in the first memory block BLOCK<1> 154 include a total of 16 pages. The search range of an initial operation may be the total 16 pages which are the entire pages PAGE<0:15> included in the first memory block BLOCK<1> 154. It may be assumed that N is 2. In this case, K obtained by dividing the total 16 pages by 2 may be 8.

Therefore, the controller 130 may select one page for each interval of eight pages based on the starting page PAGE0 among the pages PAGE<0:15> included in the first memory block BLOCK<1> 154 and check the states of the selected pages. In other words, the controller 130 may select a seventh page PAGE7 and a fifteenth page PAGE15 among the pages PAGE<0:15> included in the first memory block BLOCK<1> 154 and check the states of the selected pages.

Consequently, it may be seen that the seventh page PAGE7 of the first memory block BLOCK<1> 154 is in the program state, and the fifteenth page PAGE15 is in the erase state.

The range set operation to reset the search range may be performed to include seven pages which are (K−1) pages based on the result of checking of the states of the selected pages the state of each of the two pages PAGE7 and PAGE15 among the pages PAGE<0:15> included in the first memory block BLOCK<1> 154. In other words, although the entire pages PAGE<0:15> included in the first memory block BLOCK<1> 154 are included in the search range before the range set operation is performed, just seven pages may be reset to be included in the search range after the range set operation is performed.

The range set operation may reset seven pages, which are (K−1) pages, included between two pages, which at an opposite state, as the search range based on the result of checking of the states of the selected pages the state of each of the two pages PAGE7 and PAGE15 among the pages PAGE<0:15> included in the first memory block BLOCK<1> 154. The seventh page PAGE7 may be in the program state, and the fifteenth page PAGE15 may be in the erase state. Accordingly, an eighth page PAGE8, a ninth page PAGE9, a tenth page PAGE10, an eleventh page PAGE11, a twelfth page PAGE12, a thirteenth page PAGE13 and a fourteenth page PAGE14 which are seven pages included between the seventh page PAGE7 and the fifteenth page PAGE15 may be reset as the search range through the range set operation.

The (K−1) pages included in the search range that is reset through the range set operation may be sequentially selected through the binary search, and the states of the selected pages may be checked. For example, as shown in FIG. 13D, seven pages included in the search range that is reset through the range set operation may be non-sequentially selected through the binary search, and the state of the selected pages may be checked. In other words, the eighth page PAGE8, the ninth page PAGE9, the tenth page PAGE10, the eleventh page PAGE11, the twelfth page PAGE12, the thirteenth page PAGE13 and the fourteenth page PAGE14 which are seven pages included between the seventh page PAGE7 and the fifteenth page PAGE15 may be reset as the search range, and the eighth page PAGE8, the ninth page PAGE9, the tenth page PAGE10, the eleventh page PAGE11, the twelfth page PAGE12, the thirteenth page PAGE13 and the fourteenth page PAGE14 may be non-sequentially checked through the binary search.

Since detailed operations of the binary search shown in FIG. 13D are substantially similar to those shown in FIG. 13A, the operations will be described in brief.

The eleventh page PAGE11 among the eighth to fourteenth pages PAGE<8:14> which are the search range reset through the range set operation may be selected through the binary search. The state of the selected eleventh page PAGE11 may be in the program state. Accordingly, a page selected through the binary search subsequent to the eleventh page PAGE11 may be the thirteenth page PAGE13. The state of the selected thirteenth page PAGE13 may be in the program state. Accordingly, a page selected through the binary search subsequent to the thirteenth page PAGE13 may be a fourteenth page PAGE14. The state of the fourteenth page PAGE14 may be in the erase state. While the search range is reset and the states of the pages included in the reset search range are checked through the binary search, the states of the pages, i.e., the thirteenth page PAGE13 and the fourteenth page PAGE14, which are the boundary page between the program state pages and the erase state pages, in the first memory block BLOCK<1> 154 may be checked. Therefore, it may be seen that the erase page which is the boundary page between the program state pages and the erase state pages in the first memory block BLOCK<1> 154 is the fourteenth page PAGE14.

It may be assumed that the pages PAGE<0:15> included in the second memory block BLOCK<2> 156 include a total of 16 pages. The search range of an initial operation may be the total 16 pages which are the entire pages PAGE<0:15> included in the second memory block BLOCK<2> 156. It may be assumed that N is 2. In this case, K obtained by dividing the total 16 pages by 2 may be 8.

Therefore, the controller 130 may select one page for each interval of eight pages based on the starting page PAGE0 among the pages PAGE<0:15> included in the second memory block BLOCK<2> 156 and check the states of the selected pages. In other words, the controller 130 may select a seventh page PAGE7 and a fifteenth page PAGE15 among the pages PAGE<0:15> included in the second memory block BLOCK<2> 156 and check the states of the selected pages.

Consequently, it may be seen that the seventh page PAGE7 of the second memory block BLOCK<2> 156 is in the erase state, and the fifteenth page PAGE15 is in the erase state.

The range set operation to reset the search range may be performed to include seven pages which are (K−1) pages based on the result of checking of the states of the selected pages the state of each of the two pages PAGE7 and PAGE15 among the pages PAGE<0:15> included in the second memory block BLOCK<2> 156. In other words, although the entire pages PAGE<0:15> included in the second memory block BLOCK<2> 156 are included in the search range before the range set operation is performed, just seven pages may be reset to be included in the search range after the range set operation is performed.

The range set operation may reset seven pages, which are (K−1) pages, included between two pages, which at an opposite state, as the search range based on the result of checking of the states of the selected pages the state of each of the two pages PAGE7 and PAGE15 among the pages PAGE<0:15> included in the second memory block BLOCK<2> 156. The seventh page PAGE7 and the fifteenth page PAGE15 may be in the erase state. However, it may be inferred from the erase states of the seventh page PAGE7 and the fifteenth page PAGE15 that the address of the page in the program state is less than that of the seventh page PAGE7.

The search range reset through the range set operation based on the result of checking the state of each of the two pages PAGE7 and PAGE15 among the pages PAGE<0:15> included in the second memory block BLOCK<2> 156 may be seven pages with addresses less than the seventh page PAGE7, i.e., the zeroth page PAGE0, a first page PAGE1, a second page PAGE2, a third page PAGE3, a fourth page PAGE4, a fifth page PAGE5 and a sixth page PAGE6.

The (K−1) pages included in the search range that is reset through the range set operation may be sequentially selected through the binary search, and the states of the selected pages may be checked. For example, as shown in FIG. 13D, seven pages included in the search range that is reset through the range set operation may be non-sequentially selected through the binary search, and the state of the selected pages may be checked. In other words, the zeroth page PAGE0, the first page PAGE1, the second page PAGE2, the third page PAGE3, the fourth page PAGE4, the fifth page PAGE5 and the sixth page PAGE6 which are seven pages included between the zeroth page PAGE0 and the seventh page PAGE7 may be reset as the search range, and the zeroth page PAGE0, the first page PAGE1, the second page PAGE2, the third page PAGE3, the fourth page PAGE4, the fifth page PAGE5 and the sixth page PAGE6 may be non-sequentially checked through the binary search.

Since detailed operations of the binary search shown in FIG. 13D are substantially similar to those shown in FIG. 13A, the operations will be described in brief.

The third page PAGE3 among the zeroth to sixth pages PAGE<0:6> which are the search range reset through the range set operation may be selected through the binary search. The state of the selected third page PAGE3 may be in the program state. Accordingly, a page selected through the binary search subsequent to the third page PAGE3 may be the fifth page PAGE5. The state of the selected fifth page PAGE5 may be in the program state. Accordingly, a page selected through the binary search subsequent to the fifth page PAGE5 may be the sixth page PAGE6. The state of the sixth page PAGE6 may be in the program state. While the search range is reset and the states of the pages included in the reset search range are checked through the binary search, the states of the pages, i.e., the sixth page PAGE6 and the seventh page PAGE7, which are the boundary page between the program state pages and the erase state pages, in the second memory block BLOCK<2> 156 may be checked. Therefore, it may be seen that the erase page which is the boundary page between the program state pages and the erase state pages in the second memory block BLOCK<2> 156 is the seventh page PAGE7.

Figure 13E:
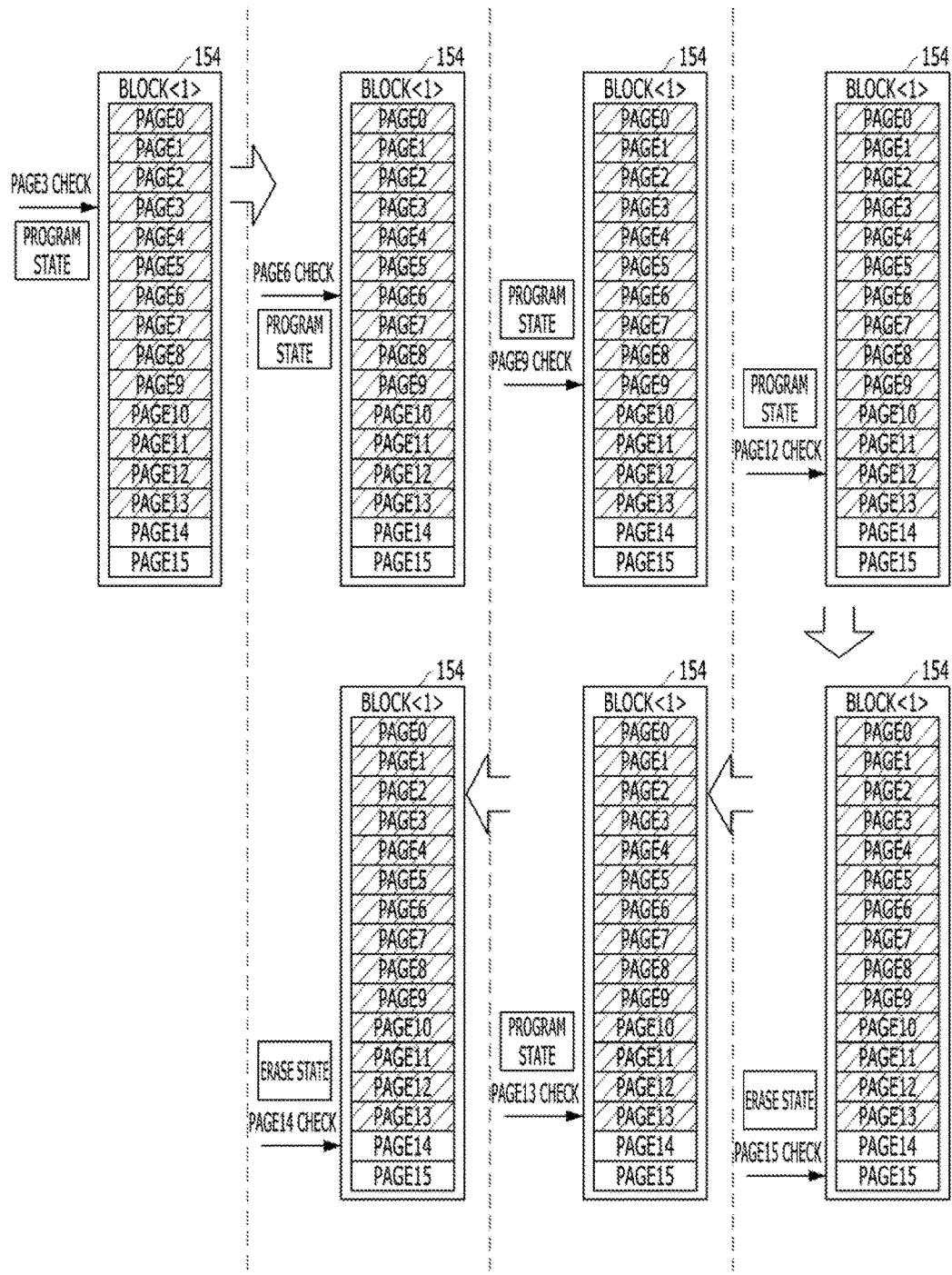
Figure 13F:
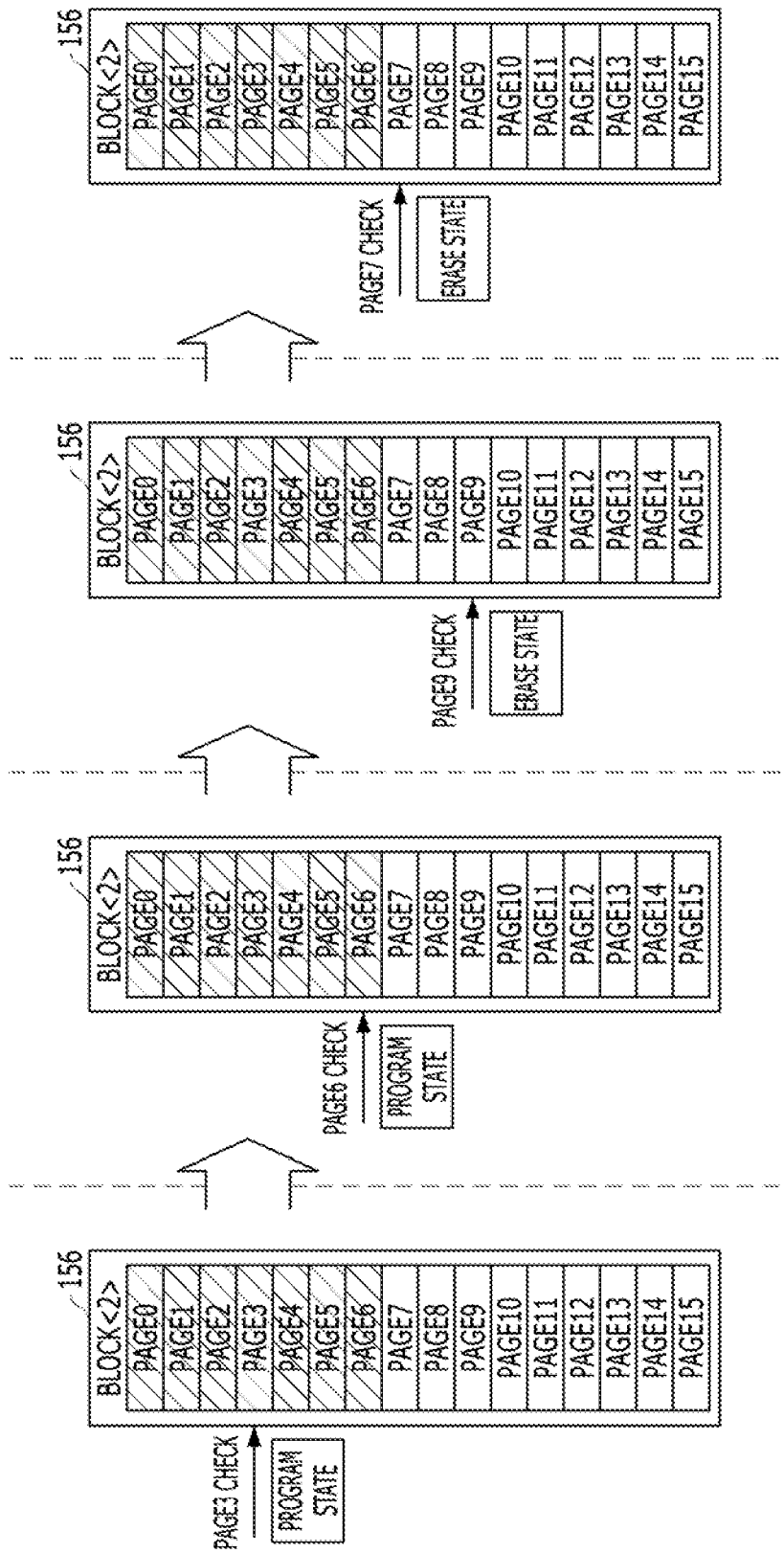

Referring to FIGS. 13E and 13F, according to an embodiment of the present invention, the controller 130 performs the scan operation to search for the page which is the boundary page between the program state pages and the erase state pages in each of the first memory block BLOCK<1> 154 and the second memory block BLOCK<2> 156 included in the memory device 150.

More specifically, in the scan operation of the controller 130 shown in FIGS. 13E and 13F, one page may be sequentially selected for each interval of M pages from the starting page PAGE0 among the pages PAGE<0:15> included in each of the first memory block BLOCK<1> 154 and the second memory block BLOCK<2> 156 which are the open blocks, and the selected pages may be checked. When two consecutively selected pages are in an opposite state, pages included between the two consecutively selected pages may be selected through a linear search, and the states of the selected pages may be checked.

Referring to FIG. 13E, it may be assumed that the pages PAGE<0:15> included in the first memory block BLOCK<1> 154 include a total of 16 pages. It may be assumed that M is 3.

Therefore, the controller 130 may check a state of a third page PAGE3 spaced apart at intervals of three pages from a zeroth page PAGE0 which is the starting page of the first memory block BLOCK<1> 154. As a result of the checking of the state, the third page PAGE3 of the first memory block BLOCK<1> 154 may be in the program state.

The controller 130 may check a state of a sixth page PAGE6 spaced apart at intervals of three pages from the third page PAGE3, which is in the program state, of the first memory block BLOCK<1> 154. As a result, the sixth page PAGE6 of the first memory block BLOCK<1> 154 may be in the program state. Since the third page PAGE3 and the sixth page PAGE6 of the first memory block BLOCK<1> 154 are in the program state, a next operation may be performed without an additional operation.

The controller 130 may check a state of a ninth page PAGE9 spaced apart at intervals of three pages from the sixth page PAGE6, which is in the program state, of the first memory block BLOCK<1> 154. As a result, the ninth page PAGE9 of the first memory block BLOCK<1> 154 may be in the program state. Since the sixth page PAGE6 and the ninth page PAGE9 of the first memory block BLOCK<1> 154 are in the program state, a next operation may be performed without an additional operation.

The controller 130 may check a state of a twelfth page PAGE12 spaced apart at intervals of three pages from the ninth page PAGE9, which is in the program state, of the first memory block BLOCK<1> 154. As a result, the twelfth page PAGE12 of the first memory block BLOCK<1> 154 may be in the program state. Since the ninth page PAGE9 and the twelfth page PAGE12 of the first memory block BLOCK<1> 154 are in the program state, a next operation may be performed without an additional operation.

The controller 130 may check a state of a fifteenth page PAGE15 spaced apart at intervals of three pages from the twelfth page PAGE12, which is in the program state, of the first memory block BLOCK<1> 154. As a result, the fifteenth page PAGE15 of the first memory block BLOCK<1> 154 may be in the erase state. Since the twelfth page PAGE12 of the first memory block BLOCK<1> 154 is in the program and the fifteenth page PAGE15 of the first memory block BLOCK<1> 154 is in the erase state, it may be seen that two consecutively selected pages are in the opposite states.

Accordingly, a thirteenth page PAGE13 and a fourteenth page PAGE14 included between the twelfth page PAGE12 of the first memory block BLOCK<1> 154 selected earlier and the fifteenth page PAGE15 of the first memory block BLOCK<1> 154 selected next may be selected through the linear search, and the states of the selected pages may be sequentially checked. It may be checked that the thirteenth page PAGE13 of the first memory block BLOCK<1> 154 is in the program state. However, it may not be sure if the thirteenth page PAGE13 is the erase page which is the boundary page between the program state pages and the erase state pages of the first memory block BLOCK<1> 154 with reference to the state of the thirteenth page PAGE13. Thus, the fourteenth page PAGE14 of the first memory block BLOCK<1> 154 may be checked, and it may be checked that the fourteenth page PAGE14 is in the erase state. Consequently, it may be seen that the erase page which is the boundary page between the program state pages and the erase state pages of the first memory block BLOCK<1> 154 is the fourteenth page PAGE14.

Referring to FIG. 13F, it may be assumed that the pages PAGE<0:15> included in the second memory block BLOCK<2> 156 include a total of 16 pages. It may be further assumed that M is 3.

Therefore, the controller 130 may check a state of a third page PAGE3 spaced apart at intervals of three pages from a zeroth page PAGE0 which is the starting page of the second memory block BLOCK<2> 156. As a result, the third page PAGE3 of the second memory block BLOCK<2> 156 may be in the program state.

The controller 130 may check a state of a sixth page PAGE6 spaced apart at intervals of three pages from the third page PAGE3, which is in the program state, of the second memory block BLOCK<2> 156. As a result, the sixth page PAGE6 of the second memory block BLOCK<2> 156 may be in the program state. Since the third page PAGE3 and the sixth page PAGE6 of the second memory block BLOCK<2> 156 are in the program state, a next operation may be performed without an additional operation.

The controller 130 may check a state of a ninth page PAGE9 spaced apart at intervals of three pages from the sixth page PAGE6, which is in the program state, of the second memory block BLOCK<2> 156. As a result, the ninth page PAGE9 of the second memory block BLOCK<2> 156 may be in the erase state. Since the sixth page PAGE6 of the second memory block BLOCK<2> 156 is in the program state and the ninth page PAGE9 of the second memory block BLOCK<2> 156 is in the erase state, it may be seen that consecutively selected two pages are in the opposite states.

Accordingly, a seventh page PAGE7 and an eighth page PAGE8 included between the sixth page PAGE6 of the second memory block BLOCK<2> 156 selected earlier and the ninth page PAGE9 of the second memory block BLOCK<2> 156 selected next may be selected through the linear search, and the states of the selected pages may be sequentially checked. It may be checked that the seventh page PAGE7 of the second memory block BLOCK<2> 156 is in the erase state. The fact that the seven the page PAGE7 is in the erase state may indicate that the erase page which is the boundary page between the program state pages and the erase state pages of the second memory block BLOCK<2> 156 is the seventh page PAGE7. Therefore, it does not need to check the eighth page PAGE8 of the second memory block BLOCK<2> 156.

In the scan operation of the controller 130 shown in FIGS. 13E and 13F, when the erase page, which is the boundary page between the program state pages and the erase state pages, is searched between the starting page PAGE0 and the last page PAGE15 among the pages PAGE<0:15> included in each of the first memory block BLOCK<1> 154 and the second memory block BLOCK<2> 156 which are the open blocks, a way to non-sequentially select pages at predetermined intervals of pages may be used. Therefore, even though the selected pages are just a portion of the pages PAGE<0:15>, the program/erase state of the selected pages may be checked, and subsequently it is possible to search and identify the erase page which is the boundary page between the program state pages and the erase state pages.

According to embodiments of the present invention, since an erase page is searched through an operation that checks the states of some pages that are non-sequentially selected among a plurality of pages included in an open memory block after a sudden power-off (SPO), the erase page may be searched and identified while the number of check target pages is minimized.

While the present invention has been described with respect to specific embodiments, the embodiments are not intended to be restrictive of the scope of the invention. The present invention may be achieved in various ways through substitution, change, and modification, as it should be apparent to those skilled in the art of the present invention, without departing from the spirit and/or scope of the present invention as defined by the following claims.

What is claimed is:

1. A memory system, comprising:
   a memory device including a plurality of memory blocks each memory block including a plurality of pages; and
   a controller suitable for non-sequentially selecting some pages among a plurality of pages included in an open block among the plurality of blocks, checking a program state or an erase state of each of the selected pages, and searching for a boundary page between the program state pages and the erase state pages among the plurality of pages,
   wherein the controller non-sequentially selects pages through a binary search between a starting page and a last page among the plurality of pages,
   wherein when two pages that are consecutively selected through the binary search are in opposite states and physically continuous to each other, the controller selects a page between the two pages, which is in the erase state as the boundary page, and
   wherein when two pages that are consecutively selected through the binary search are in opposite states and are not physically continuous to each other, the controller sequentially selects pages included between the two consecutively selected pages through a linear search and checks the state of each of the selected pages.

2. The memory system of claim 1, wherein the controller enters a scan mode in a power-on state after a sudden power-off occurs during a program operation on the plurality of blocks, and classifies the memory blocks in closed, open and free memory blocks.

3. A memory system, comprising:
   a memory device including a plurality of memory blocks each memory block including a plurality of pages; and
   a controller suitable for non-sequentially selecting some pages among a plurality of pages included in an open block among the plurality of blocks, checking a program state or an erase state of each of the selected pages, and searching for a boundary page between the program state pages and the erase state pages among the plurality of pages,
   wherein the controller selects one page for each interval of K pages obtained by dividing all pages included in a search range by N, checks a state of the selected pages, and repeats a range set operation to reset the search range to include (K−1) pages based on a check result until the number of (K−1) pages is less than the predetermined number of pages and sets all the pages included in the open block at an initial stage as the search range.

4. The memory system of claim 3, wherein the range set operation is to select one page for each interval of K pages obtained by dividing all the pages included in the search range and the program/erase states of the respective selected pages and reset the (K−1) pages included between two pages which are in the opposite states as the search range.

5. The memory system of claim 3, wherein the controller sequentially selects the (K−1) pages included in the search range through the linear search and checks the state of each of the selected pages after the number of the (K−1) pages is less than the predetermined number of pages through the range set operation.

6. The memory system of claim 3, wherein the controller non-sequentially selects the (K−1) pages included in the search range through the binary search and checks the state of each of the selected pages after the number of the (K−1) pages is less than the predetermined number of pages through the range set operation.

7. A memory system, comprising:
a memory device including a plurality of memory blocks each memory block including a plurality of pages; and
a controller suitable for non-sequentially selecting some pages among a plurality of pages included in an open block among the plurality of blocks, checking a program state or an erase state of each of the selected pages, and searching for a boundary page between the program state pages and the erase state pages among the plurality of pages,
wherein the controller sequentially selects one page for each interval of M pages from a staring page among the plurality of pages and checks the states of the selected pages and when a page selected earlier and a page selected next among two pages that are consecutively selected are in the opposite states, the controller selects pages included between the page selected earlier and the page selected next through a linear search and checks the state of each of the selected pages.

8. A method for operating a memory system including a memory device including a plurality of blocks, comprising:
classifying the plurality of blocks into one of a closed block, an open block, and a free block in response to entry into a scan mode;
non-sequentially selecting some pages among a plurality of pages included in the open block;
checking the program/erase states of the selected pages;
searching for an erase state page which is a boundary between the program state and the erase state among the plurality of pages based on the checking result
wherein the non-sequentially selecting of some of the pages includes:
non-sequentially selecting pages between a starting page and a last page among the plurality of pages through a binary search,
wherein the non-sequentially selecting of some of the pages includes:
selecting a page in the erase state among a page selected earlier and a page selected next among two pages that are consecutively selected within intervals of the predetermined number of pages through the binary search as the erase state page which is the boundary page between the program state pages and the erase state pages in the open block when the page selected earlier and the page selected next are in the opposite states and physically continuous to each other, and
wherein the non-sequentially selecting of some of the pages further includes:
sequentially selecting pages included between the page selected earlier and the page selected next through a linear search when the page selected earlier and the page selected next are in the opposite states and physically discontinuous to each other.

9. The method of claim 8, wherein the resetting of the search range includes:
selecting one page for each interval of K pages obtained by dividing all the pages included in the search range by N;
checking the states of the selected pages; and
resetting the (K−1) pages included between two pages which are in the opposite states as the search range.

10. The method of claim 8, wherein the searching of the erase state page further includes:
sequentially selecting the (K−1) pages included in the search range through the linear search; and
checking the states of the selected pages after the number of (K−1) pages is less than the predetermined number of pages through the repeated resetting of the search range.

11. The method of claim 8, wherein the searching of the erase state page further includes:
non-sequentially selecting the (K−1) pages included in the search range through the binary search; and
checking the states of the selected pages after the number of K pages is less than the predetermined number of pages through the repeated resetting of the search range.

12. The method of claim 8, further comprising:
entering the scan mode in a power-on state after a sudden power-off occurs during a program operation on the blocks.

13. A method for operating a memory system including a memory device including a plurality of blocks, comprising:
classifying the plurality of blocks into one of a closed block, an open block, and a free block in response to entry into a scan mode;
non-sequentially selecting some pages among a plurality of pages included in the open block;
checking the program/erase states of the selected pages;
searching for an erase state page which is a boundary between the program state and the erase state among the plurality of pages based on the checking result,
wherein the searching of the erase state page includes:
selecting one page for each interval of K pages obtained by dividing all pages included in a search range by N;
checking the states of the selected pages;
resetting the search range to include (K−1) pages based on the checking result; and
repeatedly resetting the search range until the number of (K−1) pages is less than the predetermined number of pages after all the plurality of pages at an initial stage are set as the search range.

14. A method for operating a memory system including a memory device including a plurality of blocks, comprising:
classifying the plurality of blocks into one of a closed block, an open block, and a free block in response to entry into a scan mode;
non-sequentially selecting some pages among a plurality of pages included in the open block;
checking the program/erase states of the selected pages;

searching for an erase state page which is a boundary between the program state and the erase state among the plurality of pages based on the checking result, wherein the searching of the erase state page includes:
sequentially selecting one page for each interval of M pages from a starting page among the plurality of pages;
selecting pages included between a page selected earlier and a page selected next among two pages that are consecutively selected through the linear search when the page selected earlier and the page selected next are in the opposite states; and
checking the state of each of the selected pages.

\* \* \* \* \*